(12) United States Patent
Byun et al.

(10) Patent No.: US 9,601,179 B2
(45) Date of Patent: Mar. 21, 2017

(54) SEMICONDUCTOR MEMORY DEVICE, METHOD OF PERFORMING A REFRESH FOR SEMICONDUCTOR MEMORY DEVICE AND REFRESH COUNTER IN SEMICONDUCTOR MEMORY DEVICE

(71) Applicant: Samsung Electronics Co., Ltd., Suwon-si (KR)

(72) Inventors: Young-Yong Byun, Seoul (KR); Whi-Young Bae, Gwangju-si (KR)

(73) Assignee: SAMSUNG ELECTRONICS CO., LTD., Samsung-ro, Yeongtong-gu, Suwon-si (KR)

( * ) Notice: Subject to any disclaimer, the term of this patent is extended or adjusted under 35 U.S.C. 154(b) by 0 days.

(21) Appl. No.: 14/723,261

(22) Filed: May 27, 2015

(65) Prior Publication Data

US 2016/0027492 A1    Jan. 28, 2016

(30) Foreign Application Priority Data

Jul. 28, 2014    (KR) ........................ 10-2014-0095620

(51) Int. Cl.
*G11C 7/00*  (2006.01)
*G11C 11/406*  (2006.01)
*G11C 8/10*  (2006.01)
*G11C 11/408*  (2006.01)
*G11C 8/04*  (2006.01)

(52) U.S. Cl.
CPC .......... *G11C 11/40618* (2013.01); *G11C 8/10* (2013.01); *G11C 11/40611* (2013.01); *G11C 8/04* (2013.01); *G11C 11/406* (2013.01); *G11C 11/408* (2013.01)

(58) Field of Classification Search
CPC ............. G11C 11/406; G11C 11/4076; G11C 11/40618; G11C 8/12; G11C 8/10; G11C 8/04; G11C 8/08; G11C 11/4091; G11C 29/02
USPC ........................... 365/222, 230.06, 236, 239
See application file for complete search history.

(56) References Cited

U.S. PATENT DOCUMENTS

| | | | |
|---|---|---|---|
| 6,333,888 B1 | 12/2001 | Nakazawa | |
| 6,876,592 B2 | 4/2005 | Takahashi et al. | |
| 6,963,518 B2 | 11/2005 | Sasaki et al. | |
| 7,145,828 B2 | 12/2006 | Lee et al. | |
| 7,388,799 B2 * | 6/2008 | An ........................ | G11C 11/406 365/185.09 |

(Continued)

FOREIGN PATENT DOCUMENTS

| | | |
|---|---|---|
| KR | 10-2001-0004570 A | 1/2001 |
| KR | 10-2007-0115260 A | 12/2007 |
| KR | 10-2008-0029576 A | 4/2008 |

*Primary Examiner* — David Lam
(74) *Attorney, Agent, or Firm* — Muir Patent Law, PLLC

(57) ABSTRACT

A semiconductor memory device may include a memory cell array, a first decoder and a second decoder. The memory cell array includes a plurality of memory cell rows. The first decoder is configured to select a first number of memory cell rows of the plurality of memory cell rows based on a selected refresh row address of a set of row addresses. The second decoder is configured to select a second number of memory cell rows of the plurality of memory cell rows based on the selected refresh row address. A total number of the first number and the second number is varied in response to the selected refresh row address.

20 Claims, 28 Drawing Sheets

(56) References Cited

U.S. PATENT DOCUMENTS 7,929,369 B2    4/2011  Lee et al.
8,854,911 B2 *  10/2014  Shiah .................... G11C 11/402
                                                        365/222

* cited by examiner

SEMICONDUCTOR MEMORY DEVICE, METHOD OF PERFORMING A REFRESH FOR SEMICONDUCTOR MEMORY DEVICE AND REFRESH COUNTER IN SEMICONDUCTOR MEMORY DEVICE

CROSS-REFERENCE TO RELATED APPLICATION(S)

This US non-provisional application claims the benefit of priority under 35 USC §119 to Korean Patent Application No. 10-2014-0095620, filed on Jul. 28, 2014, in the Korean Intellectual Property Office, the contents of which are incorporated herein in their entirety by reference.

BACKGROUND

1. Field

Example embodiments relate to a semiconductor memory device, and more particularly to a refresh counter in a semiconductor memory device, and method of performing a refresh for the semiconductor memory device.

2. Discussion of the Related Art

Along with rapid developments in capacities and speeds of semiconductor memory devices widely used in electronic devices, power consumption of semiconductor memory devices has been increasing. Particularly, in case of portable electronic devices, it is very important to reduce power consumption of semiconductor memory devices in portable electronic devices.

For example, a dynamic random access memory (DRAM) is a volatile semiconductor memory device which stores data by using charges stored in a capacitor. Since charges stored in a capacitor may be leaked in various ways as time passes, a DRAM has a finite data retention characteristic. For solving finite data retention, it is typically necessary for a DRAM to refresh periodically to charge/discharge a capacitor according to data stored in the DRAM.

In general, if a refresh period becomes shorter or multiple word lines are simultaneously selected, data retention characteristic may be improved but power consumption may be increased during refreshing a DRAM.

SUMMARY

Some example embodiments may provide a semiconductor memory device capable of enhancing performance.

Some example embodiments may provide a method of performing a refresh for a semiconductor memory device, capable of enhancing performance.

Some example embodiments may provide a refresh counter in a semiconductor memory device, capable of enhancing performance According to example embodiments, a semiconductor memory device includes a memory cell array, a first decoder and a second decoder. The memory cell array includes a plurality of memory cell rows. The first decoder is configured to perform a refresh on a first number of memory cell rows of the plurality of memory cell rows based on a selected refresh row address of a set of row addresses. The second decoder is configured to perform a refresh on a second number of memory cell rows of the plurality of memory cell rows based on the selected refresh row address. A total number of the first number of rows and the second number of rows is varied in response to the selected refresh row address.

In example embodiments, the first number of rows may be greater than the second number of roes.

In example embodiments, the first number of rows may be smaller than the second number of rows.

In example embodiments, the first number of rows may be same as the second number of rows.

In example embodiments, the first number of rows and the second number of rows may be simultaneously selected in response to the selected row address.

In example embodiments, the semiconductor memory device may further include a refresh counter, a refresh signal generator and an address converting circuit. The refresh counter may generate the set of refresh row addresses in response to a refresh command. The refresh signal generator may be configured to generate a refresh enable signal such that the first and second decoders perform a refresh operation, in response to the refresh command. The address converting circuit may be configured to convert a first decoded row address to a changed row address to provide the changed row address to the second decoder. The first decoded row address may be provided to the first decoder.

In example embodiments, the memory cell array includes a plurality bank arrays and the memory cell rows may be included in one of the plurality bank arrays. Each address of the set of row addresses may be an r-bit abbreviated refresh row address obtained by omitting q bits from a p-bit address for selecting memory cell rows, where q is a natural number greater than zero, r is a natural number greater than q and p=q+r.

Each of the bank arrays may be divided into at least a first sub-array group and a second sub-array group based on at least one bit of the omitted q bits.

The first decoder may be configured to perform a refresh on the first number of memory cell rows in the first sub-array group based on the selected refresh row address.

The second decoder may be configured to perform a refresh on the second number of memory cell rows in the second sub-array group based on the selected refresh row address.

Each of at least the first sub-array group and the second sub-array group may include a plurality of sub-arrays, and at least two adjacent sub-arrays of the plurality of sub-arrays do not share a bit line sense amplifier.

According to example embodiments, in a method of performing a refresh operation for a semiconductor memory device that includes a memory cell array having a plurality of memory cell rows, performing a refresh operation on a first number of memory cell rows of the plurality of memory cell rows are refreshed by a first decoder, based on a selected refresh row address of a set of row addresses, performing the refresh operation on a second number of memory cell rows of the plurality of memory cell rows are refreshed by a second decoder, based on the selected refresh row address. A total number of the first number of rows and the second number of rows may be varied in response to the selected refresh row address.

In example embodiments, the first number of rows may be greater than the second number of rows.

In example embodiments, the first number of rows may be smaller than the second number of rows.

In example embodiments, the first number of rows may be same as the second number of rows.

In example embodiments, the first number of rows and the second number of rows may be simultaneously selected in response to the selected refresh row address.

According to example embodiments, a refresh counter in a semiconductor memory device includes a first divider, a second divider and a counting block. The first divider may be configured to generate a first bit of an r-bit abbreviated refresh row address obtained by omitting q bits from a p-bit address for selecting a number of memory cell rows in response to a refresh command, where q is a natural number greater than zero, r is a natural number greater than q and p=q+r. The second divider may be configured to generate a second bit of the abbreviated refresh row address in response to the refresh command. The counting block may be configured to generate a third set of bits of the abbreviated refresh row address different from the first bit and second bit in response to the second bit.

In example embodiments, the second divider and the first divider may be configured to output the second bit and the first bit, respectively, from a first state to a third state sequentially, the first state may correspond to '00', the second state may correspond to '01' and the third state may correspond to '11'. The counting block may be configured to generate a third bit of the third set of bits by one after the second divider and the first divider output the second bit and the first bit as the third state, the third bit being adjacent to the second bit.

In example embodiments, the first divider may includes a NOR gate and first through fourth D flip-flops, and each of the first through fourth D flip-flops may include a data terminal, a clock terminal, an output terminal and an inverted output terminal.

The output terminal of the first D flip-flop may be coupled to the data terminal of the second D flip-flop, the inverted output terminal of the second D flip-flop and the output terminal of the fourth D flip-flop may be coupled to the NOR gate, an output of the NOR gate may be coupled to the data terminal of the third D flip-flop, the output terminal of the third D flip-flop may be coupled to the data terminal of the fourth D flip-flop, and the fourth D flip-flop may be configured to output the first bit at the inverted output terminal of the fourth D flip-flop. Each of the first through fourth D flip-flops may be negative-edge triggered, the refresh command may applied to each clock terminal of the first and third D flip-flops and an inverted signal of the refresh command may be applied to each clock terminal of the second and fourth D flip-flops.

In example embodiments, the second divider may include a NAND gate and first through fourth D flip-flops, and each of the first through fourth D flip-flops may include a data terminal, a clock terminal, an output terminal and an inverted output terminal.

The output terminal of the first D flip-flop may be coupled to the data terminal of the second D flip-flop, the inverted output terminal of the second D flip-flop and the output terminal of the fourth D flip-flop may be coupled to the NAND gate, an output of the NAND gate may be coupled to the data terminal of the third D flip-flop, the output terminal of the third D flip-flop may be coupled to the data terminal of the fourth D flip-flop and the fourth D flip-flop may be configured to output the second bit at the inverted output terminal. Each of the first through fourth D flip-flops may be negative-edge triggered, the refresh command may be applied to each clock terminal of the first and third D flip-flops and an inverted signal of the refresh command may be applied to each clock terminal of the second and fourth D flip-flops.

In example embodiments, the counting block may include a plurality of unit dividers that respectively generate the third set of bits.

Each of the unit dividers may include a first D flip-flop and a second D flip-flop, and each of the first and second D flip-flops may include a data terminal, a clock terminal, an output terminal and an inverted output terminal.

Each of the unit dividers of the counting block may be configured that: the output terminal of the first D flip-flop may be coupled to the data terminal of the second D flip-flop and the inverted output terminal of the second D flip-flop is coupled to the data terminal of the first D flip-flop. Each of the first and second D flip-flops may be negative-edge triggered, an (s−1)th bit of the third set of bits of the abbreviated refresh row address may be applied to the clock terminal of the first D flip-flop of an sth unit divider, where s is a natural number equal to or greater than 1 and smaller than r, an inverted signal of the (s−1)th bit may be applied to the clock terminal of the second D flip-flop of the sth unit divider. The second D flip-flop of the sth divider may be configured to output an sth bit at the inverted output terminal of the second D flip-flop of the sth unit divider.

Accordingly, the refresh counter may output abbreviated row address by sequentially counting first through third states repeatedly, the row decoder may vary a number of word lines that are simultaneously selected according to states of upper first and second bits of the abbreviated refresh row address. As a number of omitted bits in a row address designating one memory cell row increases, a number of word lines that are simultaneously selected also increases. In addition, a number of word lines that are simultaneously selected may correspond to a value between two's multiples, increase of power consumption and noise may be prevented.

According to example embodiments, a semiconductor memory device includes a memory cell array, a refresh counter, and a row decoder. The memory cell array includes a plurality of word lines, each word line is connected to memory cells. The refresh counter is configured to generate a plurality of refresh row addresses in response to a refresh command. The row decoder is configured to simultaneously select only a first set of word lines based on a selected refresh row address of the plurality of refresh row addresses, such that a first set of memory cells connected to the selected first set of word lines are refreshed. A total number of word lines of the first set of word lines is not equal to $2^n$, n is a natural number equal to or greater than 2.

According to example embodiments, a method of performing a refresh operation for a semiconductor memory device including a memory cell array including a plurality of word lines, each word line connected to memory cells, the method includes: generating a plurality of refresh row addresses in response to a refresh command, generating refresh addresses based on the plurality of generated refresh row addresses, and performing the refresh operation by simultaneously selecting only a first number of word lines based on a selected refresh row address of the plurality of refresh row addresses. The first number of word lines is not equal to $2^n$, n is a natural number equal to or greater than 2.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
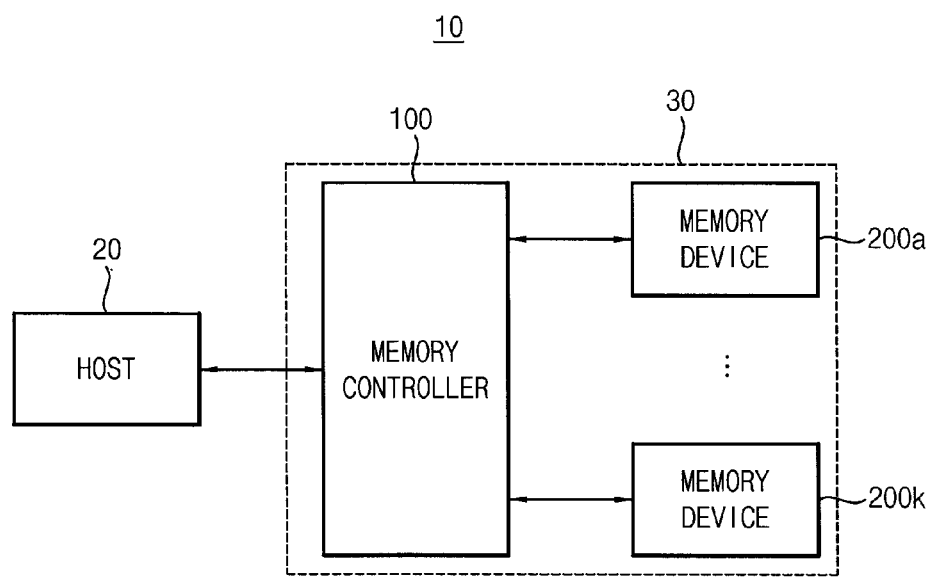
FIG. 1 is a block diagram illustrating an electronic system according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. These example embodiments are just that—examples—and many implementations and variations are possible that do not require the details provided herein. It should also be emphasized that the present disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the present disclosure. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are only used to distinguish one element from another. Thus, a first element discussed below could be termed a second element without departing from the teachings of the present disclosure. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact" refers to direct contact, unless the context indicates otherwise.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 may include a host 20 and a memory system 30. The memory system 30 may include a memory controller 100 and a plurality of semiconductor memory devices 200a~200k.

The host 20 may communicate with the memory system 30 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 20 may also communicate with the memory system 30 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 30. The memory controller 100 may control an overall data exchange between the host 20 and the plurality of semiconductor memory devices 200a~200k. For example, the memory controller 100 may write data in the plurality of semiconductor memory devices 200a~200k or read data from the plurality of semiconductor memory devices 200a~200k in response to request from the host 20.

In addition, the memory controller 100 may issue operation commands to the plurality of semiconductor memory devices 200a~200k for controlling the plurality of semiconductor memory devices 200a~200k.

In some embodiments, each of the plurality of semiconductor memory devices 200a~200k may be, for example, a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

Figure 2:
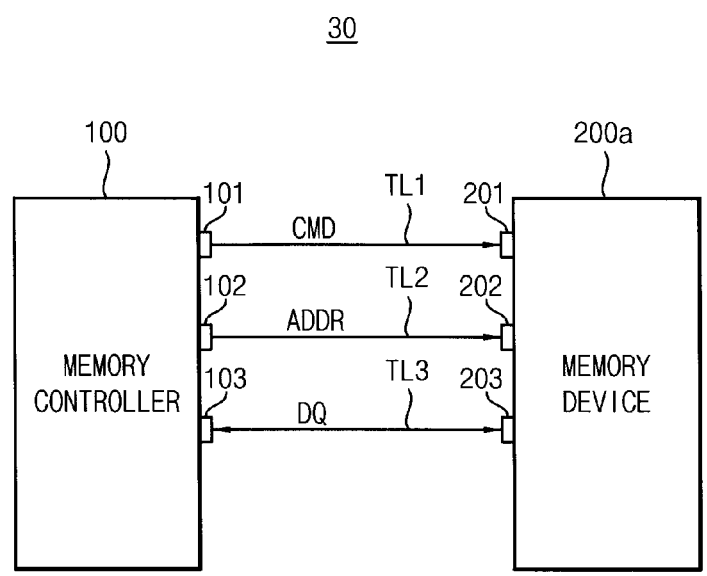
FIG. 2 is a block diagram illustrating an example of the memory system in FIG. 1 according to example embodiments.

FIG. 2 is a block diagram illustrating an example of the memory system in FIG. 1 according to example embodiments.

In FIG. 2, only one semiconductor memory device 200a in communication with the memory controller 100 is illustrated for convenience. However, the details discussed herein related to semiconductor memory device 200a may equally apply to the other semiconductor memory devices 200b~200k.

Referring to FIG. 2, the memory system 30 may include the memory controller 100 and the semiconductor memory device 200a. Each of the memory controller 100 and the semiconductor memory device 200a may be formed as a separate semiconductor chip or as a separate group of chips (e.g., semiconductor memory device 200a may be a stack of semiconductor chips in a semiconductor package). The memory controller 100 and the semiconductor memory device 200a may be connected to each other through corresponding command pins 101 and 201, corresponding address pins 102 and 202, corresponding data pins 103 and 203 and corresponding separate pins 104 and 204. The command pins 101 and 201 may transmit a command signal CMD through a command transmission line TL1, the address pins 102 and 202 may transmit an address signal ADDR through an address transmission line TL2, and the data pins 103 and 203 may exchange data DQ through a data transmission line TL3.

Referring to FIGS. 1 and 2, the memory controller 100 may input data to the semiconductor memory device 200a or may output data from the semiconductor memory device 200a through the data pins 103 and 203 based on the request from the host 20. In addition, the semiconductor memory device 200a may receive address from the memory controller 100 through the address pins 102 and 202.

As used herein, a semiconductor device may refer to various items such as a memory device, one or more logic devices, a semiconductor chip, a memory chip, a logic chip, a package, or combinations thereof. A semiconductor device such as a semiconductor chip, a memory chip, or a logic chip may be formed from a wafer. A semiconductor device may comprise a package which may include one or more chips stacked on a package substrate, or a package-on-package device including a plurality of packages. A semiconductor memory device refers to a semiconductor device that includes one or more memory arrays, such as a semiconductor memory chip (e.g., volatile or non-volatile memory).

An electronic device, as used herein, may refer to one of these devices and may also include products that include these devices, such as a memory module, a hard drive including additional components, a mobile phone, laptop, tablet, desktop, camera, server, computing system, or other consumer electronic device, etc.

Figure 3:
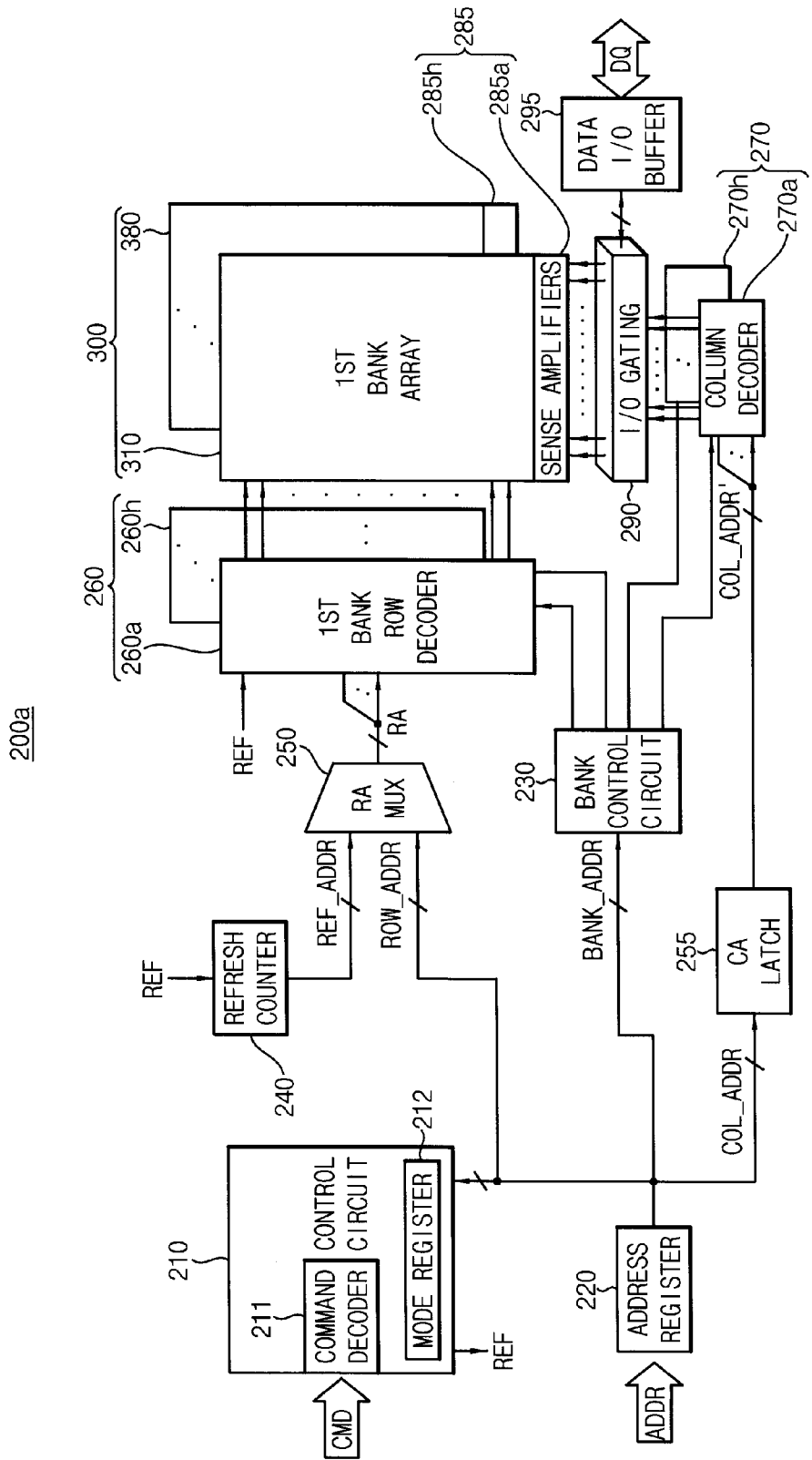
FIG. 3 is a block diagram illustrating an example of a semiconductor memory device in FIG. 2 according to example embodiments.

FIG. 3 is a block diagram illustrating an example of a semiconductor memory device in FIG. 2 according to example embodiments.

Referring to FIG. 3, the semiconductor memory device 200a may include a control circuit 210, an address register 220, a bank control circuit 230, a row address multiplexer 250, a column address latch 255, a row decoder 260, a column decoder 270, a memory cell array 300, a sense amplifier unit 285, an input/output (I/O) gating circuit 290, a data input/output (I/O) buffer 295, and a refresh counter 240.

The memory cell array 300 may include first through eighth bank arrays 310~380. The row decoder 260 may include first through eighth bank row decoders 260a~260h respectively coupled to the first through eighth bank arrays 310~380, the column decoder 270 may include first through eighth bank column decoders 270a~270h respectively coupled to the first through eighth bank arrays 310~380, and the sense amplifier unit 285 may include first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h and first through eighth bank sense amplifiers 285a~285h may form first through eighth banks Although the semiconductor memory device 200a is illustrated in FIG. 3 as including eight banks, the semiconductor memory device 200a may include any number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control circuit 230, may provide the received row address ROW_ADDR to the row address multiplexer 250, and may provide the received column address COL_ADDR to the column address latch 255.

The bank control circuit 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The refresh counter 240 may generate a refresh row address REF_ADDR for refreshing memory cell rows in the memory cell array in response to a refresh command REF from the control circuit 210. The refresh row address REF_ADDR may be an abbreviated refresh row address obtained by omitting some bits from a plurality of bits designating one or more memory cell rows.

The row address multiplexer 250 may receive the row address ROW_ADDR from the address register 220, and may receive the refresh row address REF_ADDR from the refresh counter 240. The row address multiplexer 250 may selectively output the row address ROW_ADDR or the refresh row address REF_ADDR as a row address. The row address that is output from the row address multiplexer 250 may be applied to the first through eighth bank row decoders 260a~260h.

The activated one of the first through eighth bank row decoders 260a~260h may decode the row address RA that is output from the row address multiplexer 250, and may select one or more word lines corresponding to the row address RA. For example, the activated bank row decoder may apply a word line driving voltage to the selected one or more word lines corresponding to the row address RA.

The column address latch 255 may receive the column address COL_ADDR from the address register 220, and may temporarily store the received column address COL_ADDR. In some embodiments, in a burst mode, the column address latch 255 may generate column addresses COL_ADDR' that increment from the received column address COL_ADDR. The column address latch 250 may apply the temporarily stored or generated column address COL_ADDR' to the first through eighth bank column decoders 270a~270h.

The activated one of the first through eighth bank column decoders 270a~270h may decode the column address COL_ADDR' that is output from the column address latch 255, and may control the input/output gating circuit 290 in order to output data corresponding to the column address COL_ADDR'.

The I/O gating circuit 290 may include a circuitry for gating input/output data. The I/O gating circuit 290 may further include read data latches for storing data that is output from the first through eighth bank arrays 310~380, and write drivers for writing data to the first through eighth bank arrays 310~380.

Data DQ to be read from one bank array of the first through eighth bank arrays 310~380 may be sensed by a sense amplifier coupled to the one bank array from which the data is to be read, and may be stored in the read data latches. The data DQ stored in the read data latches may be provided to the memory controller 100 via the data I/O buffer 295. Data DQ to be written in one bank array of the first through eighth bank arrays 310~380 may be provided to the data I/O buffer 295 from the memory controller 100. The write driver may write the data DQ in one bank array of the first through eighth bank arrays 310~380.

The control circuit 210 may control operations of the semiconductor memory device 200a. For example, the control circuit 210 may generate control signals for the semiconductor memory device 200a in order to perform a write operation or a read operation. The control circuit 210 may include a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may generate the refresh command REF by decoding the command CMD to provide the refresh command REF to the row decoders 260. The refresh command REF may have a plurality of clock pulses and each clock pulse may have a period of time.

Figure 4:
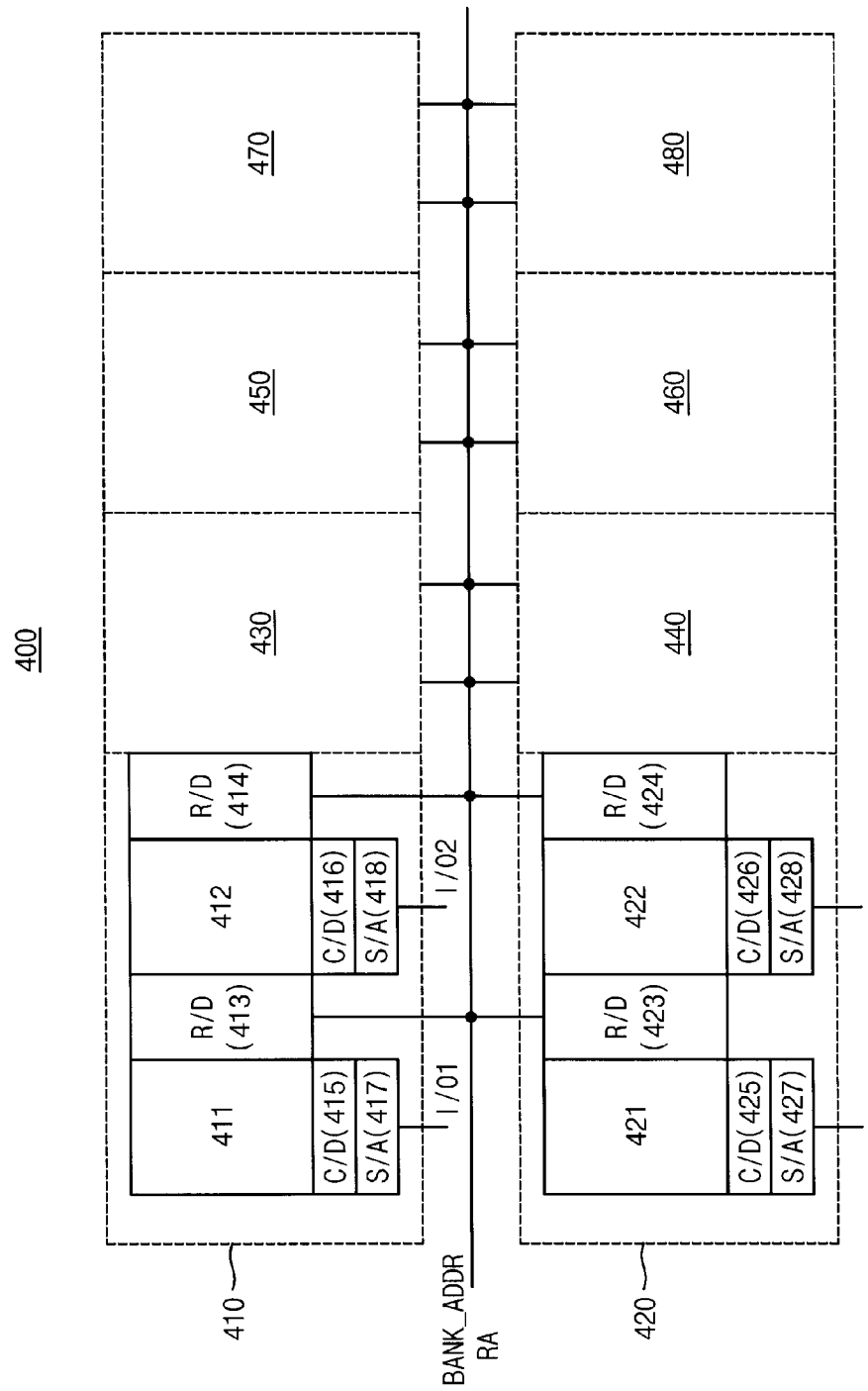
FIG. 4 is a block diagram illustrating an example of the semiconductor memory device of FIG. 3 according to example embodiments.

FIG. 4 is a block diagram illustrating an example of the semiconductor memory device of FIG. 3 according to example embodiments.

Figure 5:
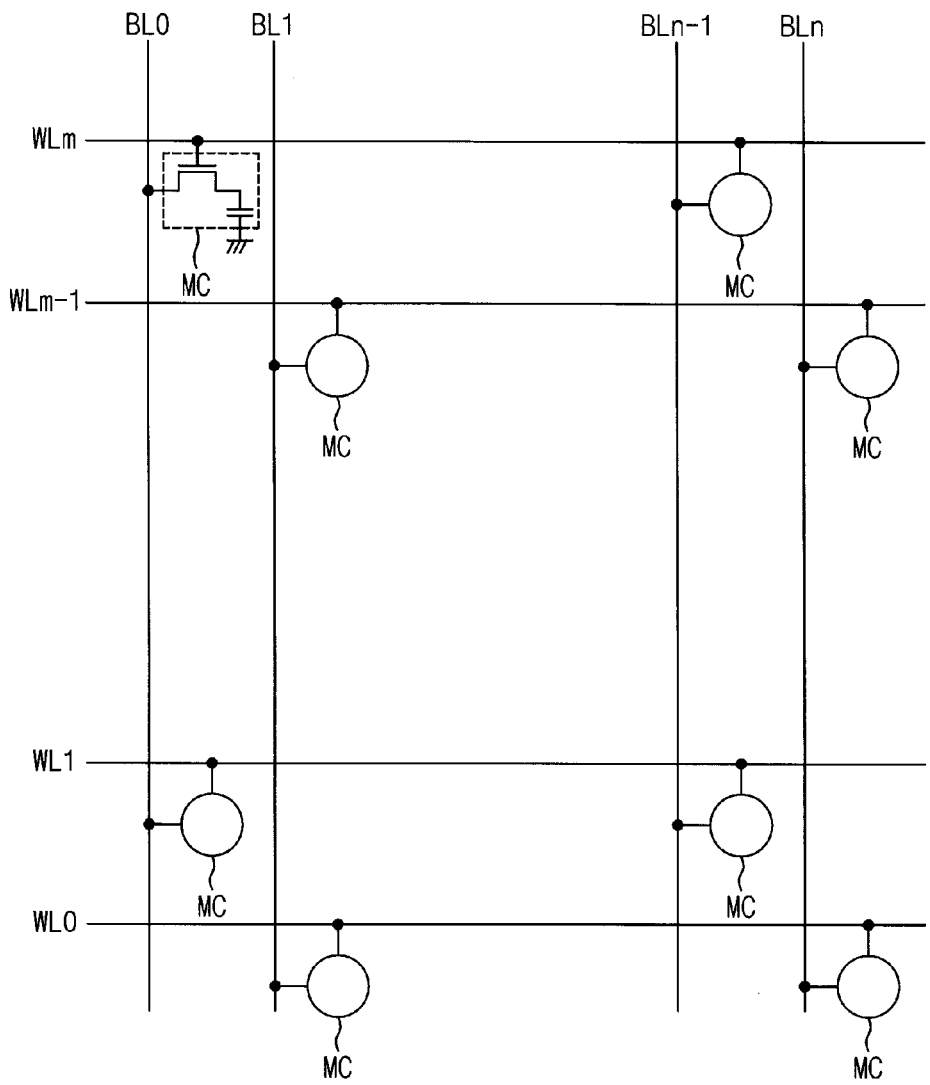
FIG. 5 is a circuit diagram illustrating one of bank arrays in FIG. 3 according to example embodiments.

Referring to FIG. 4, a semiconductor memory device 400 may include a plurality of banks 410~480 in which a plurality of memory cells are arranged in columns and rows. Each of the plurality of banks 410~480 may include a plurality of word lines WLs, a plurality of bit-lines BLs, and a plurality of memory cells MCs disposed near intersections between the word lines WLs and the bit-lines BLs, as shown in FIG. 5. In one embodiment, each of the plurality of memory cells MCs may comprise a dynamic random access memory (DRAM) cell structure. The plurality of word lines WLs to which the plurality of memory cells MCs are connected may be defined as rows of the plurality of banks 410~480, and the plurality of bit-lines BLs to which the plurality of memory cells MCs are connected may be defined as columns of each of the plurality of banks 410~480.

The semiconductor memory device 400 may include eight banks 410~480 in FIG. 4. However, the present disclosure is not limited thereto, and the number of banks included in the semiconductor memory device 400 may be any positive integer.

The first bank 410 of the plurality of banks 410~480 may include a first sub-bank 411, a second sub-bank 412, a first row decoder 413, a second row decoder 414, a first column decoder 415, and a second column decoder 416. In addition, the second bank 420 may include a first sub-bank 421, a second sub-bank 422, a first row decoder 423, a second row decoder 424, a first column decoder 425, and a second column decoder 426. Each configuration of third through eighth 430~480 may be substantially same as each configuration of the first bank 410 and the second bank 420. The first row decoder 413 and the second row decoder 414 may receive the bank address BANK_ADDR and the row address RA. The first column decoder 415 and the second column decoder 416 may receive the column addresses. One of the plurality of banks 410~480 may be selected in response to the bank address BANK_ADDR, and memory cells in the selected bank may be accessed in response to the row address RA and the column address.

The first bank 410 may be divided into a first sub-bank 411 and a second sub-bank 412. The first sub-bank 411 and the second sub-bank 412 may be arranged in a direction, for example, a row direction, in which the plurality of word lines WLs of the plurality of memory cells MCs are arranged. The first sub-bank 111 may be connected to the first row decoder 413 and the first column decoder 415. Memory cells of the first sub-bank 411 may be selected by the first row decoder 413 and the first column decoder 415. The second sub-bank 412 may be connected to the second row decoder 414 and the second column decoder 416. Memory cells of the second sub-bank 412 may be selected by the second row decoder 414 and the second column decoder 416.

The first sub-bank 411 or the second sub-bank 412 may be selected by any one bit from among the row address signals RA applied to the first row decoder 413 and the second row decoder 414. For example, the first sub-bank 411 or the second sub-bank 412 may be selected by a most significant bit (MSB).

The first sub-bank 411 and the second sub-bank 412 are respectively connected to first and second data line sense amplifier blocks 417 and 418, and are also respectively connected to first and second data input/output lines I/O1 and I/O2 which are independent from each other. Data that is read from the first sub-bank 411 may be output through the first data line sense amplifier block 417 and the first data input/output lines I/O1. Data that is read from the second sub-bank 412 may be output through the second data line sense amplifier 418 and the second data input/output lines I/O2.

Figure 6:
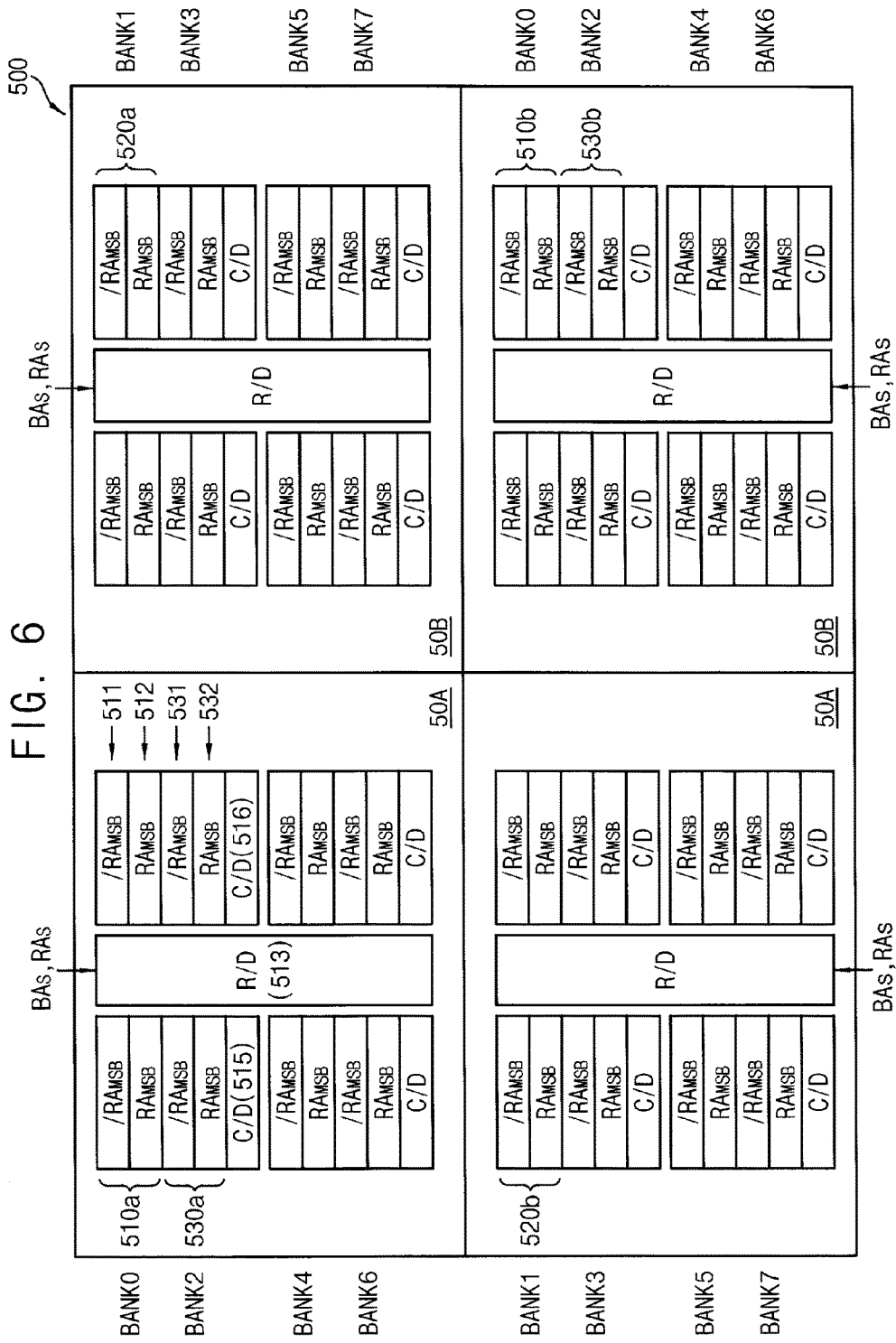
FIG. 6 is a block diagram illustrating an example of the semiconductor memory device of FIG. 3 according to example embodiments.

FIG. 6 is a block diagram illustrating an example of the semiconductor memory device of FIG. 3 according to example embodiments.

Referring to FIG. 6, a semiconductor memory device 500 may include a plurality of banks, such as first through eighth banks BANK0 through BANK7. Each of the plurality of banks has a stack bank architecture. The first through eighth banks BANK0 through BANK7 may be separated for noise distribution. The first through eighth banks BANK0 through BANK7 may be separately disposed on four equal surfaces, namely, first, second, third, and fourth quarter surfaces 50A, 50B, 50C, and 50D relative to pads which are arranged at a center of the semiconductor memory device 500. Each of the plurality of banks BANK0 through BANK7 may include a plurality of word lines WLs, a plurality of bit-lines BLs, and a plurality of memory cells MCs disposed near intersections between the plurality of word lines WLs and the plurality of bit-lines BLs, as shown in FIG. 5.

The first bank BANK0 may be disposed on the first quarter surface 50A and the fourth quarter surface 50D, and the second bank BANK1 may be disposed on the second quarter surface 50B and the third quarter surface 50C. The even banks BANK2, BANK4, and BANK6 may be disposed on the first quarter surface 50A and the fourth quarter surface 50D. The odd banks BANK3, BANK5, and BANK7 may be disposed on the second quarter surface 50B and the third quarter surface 50C.

The first bank BANK0 may include a first memory cell array block 510a disposed on the first quarter surface 50A and a memory cell array block 510b disposed on the fourth quarter surface 50D. The second bank BANK1 may include a first memory cell array block 520a disposed on the second quarter surface 50B and a memory cell array block 520b disposed on the third quarter surface 50C. The third bank BANK2 may include a first memory cell array block 530a disposed on the first quarter surface 50A and a memory cell array block 530b disposed on the fourth quarter surface 50D.

Each of the even banks BANK4 and BANK6 may include a first memory cell array block disposed on the first quarter surface 50A and a second memory cell array block disposed on the fourth quarter surface 50D. Each of the odd banks BANK3, BANK5, and BANK7 may include a first memory cell array block disposed on the second quarter surface 50B and a second memory cell array block disposed on the third quarter surface 50C.

The first quarter surface 50A of the memory device 500 may have a stack bank structure in which the first memory cell array block 510a of the first bank BANK0 and the first memory cell array block 530a of the third bank BANK2 are stacked. The first memory cell array block 510a of the first bank BANK0 may be divided into two sub-array groups 511 and 512. The first memory cell array block 530a of the third bank BANK2 may be divided into two sub-array groups 531 and 532. The sub-array groups 511 and 512 of the first bank BANK0 and the sub-array groups 531 and 532 of the third bank BANK2 may be arranged in a direction, that is, a column direction, in which bit lines of memory cells are arranged.

The first memory cell array blocks 510a and 530a of the first and third banks BANK0 and BANK2 may be separated from each other relative to a row decoder 513. The first memory cell array blocks 510a and 530a may be connected to the row decoder 513 and first and second column decoders 515 and 516. Memory cells of the first memory cell array blocks 510a and 530a may be selected by the row decoder 513 and the first and second column decoders 515 and 516.

The row decoder 513 may receive bank address signals BAs and row address signals RAs. The first and second column decoders 515 and 516 may receive column address signals (not shown). One of the first and third banks BANK0 and BANK2 may be selected according to the bank address signals BAs, and memory cells of the sub-array groups 511, 512, 531, and 532 in the selected bank may be selected according to the row address signals RAs and the column address signals.

The first sub-array group 511 or the second sub-array group 512 of the first bank BANK0 may be selected by any one bit of the row address signals RAs applied to the row decoder 513. For example, the first sub-array group 511 or the second sub-array group 512 may be selected by an MSB signal $RA_{MSB}$ of the row address signals RAs. The first sub-array group 511 may be selected by a /$RA_{MSB}$ signal, and the second sub-array group 512 may be selected by a $RA_{MSB}$ signal.

Like in the first and third banks BANK0 and BANK2, first memory cell array blocks, each of which is divided into two sub-array groups, may be stacked in the fifth and seventh banks BANK4 and BANK6. One of the sub-array groups in the fifth and seventh banks BANK4 and BANK6 may be selected by an MSB signal $RA_{MSB}$ of row address signals applied to the row decoder 513.

In the first through eighth banks BANK0 through BANK7 disposed on the other quarter surfaces, namely, the second, third, and fourth quarter surfaces 50B, 50C, and 50D, first memory cell array blocks, each of which is divided into two sub-array groups, may be stacked. One of the sub-array groups in the first through eighth banks BANK0 through BANK7 may be selected by an MSB signal $RA_{MSB}$ of row address signals applied to a row decoder disposed on a corresponding one of the quarter surfaces, namely, the second, third, and fourth quarter surfaces 50B, 50C, and 50D.

Figure 7:
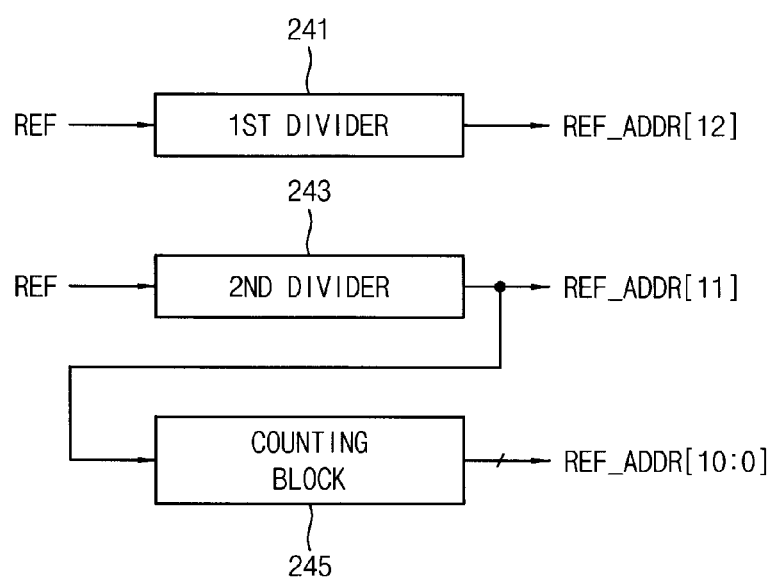
FIG. 7 is a block diagram illustrating a refresh counter in the semiconductor memory device of FIG. 3 according to example embodiments.

FIG. 7 is a block diagram illustrating a refresh counter in the semiconductor memory device of FIG. 3 according to example embodiments.

Referring to FIG. 7, the refresh counter 240 may include a first divider 241, a second divider 246 and a counting block 245.

The first divider 241 may generate a first bit REF_ADDR [12] of r-bit abbreviated refresh row address REF_ADDR obtained by omitting q-bit from p-bit address for selecting a memory cell row in response to the refresh command REF. The second divider 243 may generate a second bit REF_ADDR[11] of the abbreviated refresh row address REF_ADDR. The counting block may generate rest bits REF_ADDR[10:0] of the abbreviated refresh row address REF_ADDR in response to the second bit REF_ADDR[11].

A row address ROW_ADDR for selecting one or more memory cell rows may include 15 bits. For example, the row address ROW_ADDR may be represented as ROW_ADDR [14:0]. The refresh counter 240 may eliminate higher two bits ROW_ADDR [14:13] from 15-bit row address ROW_ADDR [14:0], may generate the abbreviated refresh row address REF_ADDR[12:0] and simultaneously refresh on multiple memory cell rows in the memory cell array 300. The refresh counter may output the first bit REF_ADDR[12] and the second bit REF_ADDR[11] of the abbreviated refresh row address from a first state to a third state sequentially and may generate a next bit REF_ADDR[10] successive to the second bit REF_ADDR[11] by one. The first state corresponds to '00', the second state corresponds to '01' and the third state corresponds to '11'.

Figure 8:
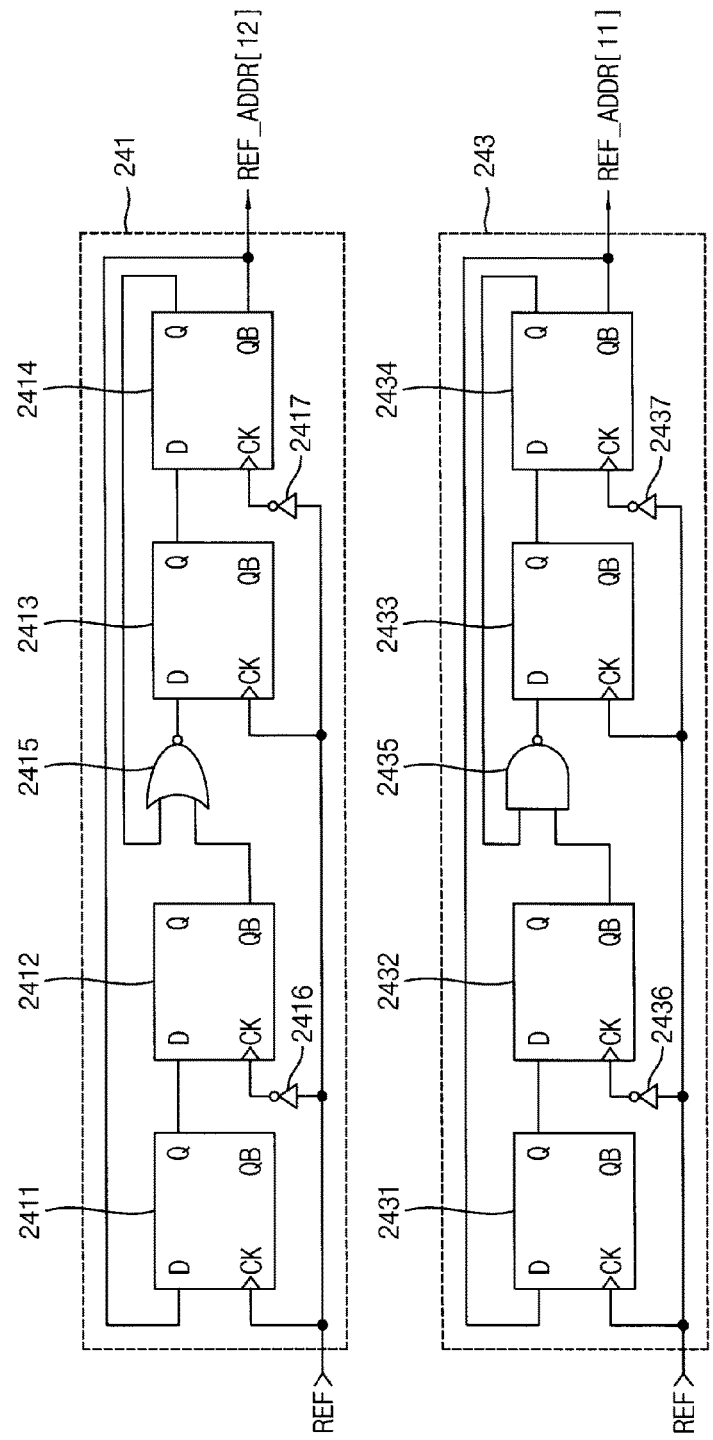
FIG. 8 is a circuit diagram illustrating the first divider and the second divider in FIG. 7 according to example embodiments.

FIG. 8 is a circuit diagram illustrating the first divider and the second divider in FIG. 7 according to example embodiments.

Referring to FIG. 8, the first divider 241 may include includes a NOR gate 2415, first through fourth D flip-flops 2411~2414 and inverters 2416 and 2417.

Each of the first through fourth D flip-flops 2411~2414 may include a data terminal D, a clock terminal CK, an output terminal Q and an inverted output terminal QB. Each of the first through fourth D flip-flops 2411~2414 may be negative-edge triggered.

The output terminal Q of the first D flip-flop 2411 is coupled to the data terminal D of the second D flip-flop 2412, the inverted output terminal QB of the second D flip-flop 2412 and the output terminal Q of the fourth D flip-flop 2414 are coupled to the NOR gate 2415, an output of the NOR gate 2415 is coupled to the data terminal D of the third D flip-flop 2413, the output terminal Q of the third D flip-flop 2413 is coupled to the data terminal D of the fourth D flip-flop 2414 and the fourth D flip-flop 2414 outputs the first bit REF_ADDR[12] at the inverted output terminal QB of the fourth D flip-flop 2414.

The refresh command REF is applied to each clock terminal CK of the first and third D flip-flops 2411 and 2413, inverted signal of the refresh command REF is applied to the clock terminal CK of the second D flip-flop 2412 by the inverter 2416 and, inverted signal of the refresh command REF is applied to the clock terminal CK of the fourth D flip-flop 2414 by the inverter 2417.

The second divider 243 may include includes a NAND gate 2435, first through fourth D flip-flops 2431~2434 and inverters 2436 and 2437.

Each of the first through fourth D flip-flops 2431~2434 may include a data terminal D, a clock terminal CK, an output terminal Q and an inverted output terminal QB. Each of the first through fourth D flip-flops 2431~2434 may be negative-edge triggered.

The output terminal Q of the first D flip-flop 2431 is coupled to the data terminal D of the second D flip-flop 2432, the inverted output terminal QB of the second D flip-flop 2432 and the output terminal Q of the fourth D flip-flop 2434 are coupled to the NAND gate 2435, an output of the NAND gate 2435 is coupled to the data terminal D of the third D flip-flop 2433, the output terminal Q of the third D flip-flop 2433 is coupled to the data terminal D of the fourth D flip-flop 2434 and the fourth D flip-flop 2434 outputs the second bit REF_ADDR[11] at the inverted output terminal QB of the fourth D flip-flop 2434.

The refresh command REF is applied to each clock terminal CK of the first and third D flip-flops 2431 and 2433, inverted signal of the refresh command REF is applied to the clock terminal CK of the second D flip-flop 2432 by the inverter 2436 and, inverted signal of the refresh command REF is applied to the clock terminal CK of the fourth D flip-flop 2434 by the inverter 2437. When an operation of each of the D flip-flops is started, the output terminal Q may have a high level "1" and the inverted output terminal QB may have a low level "0".

Figure 9:
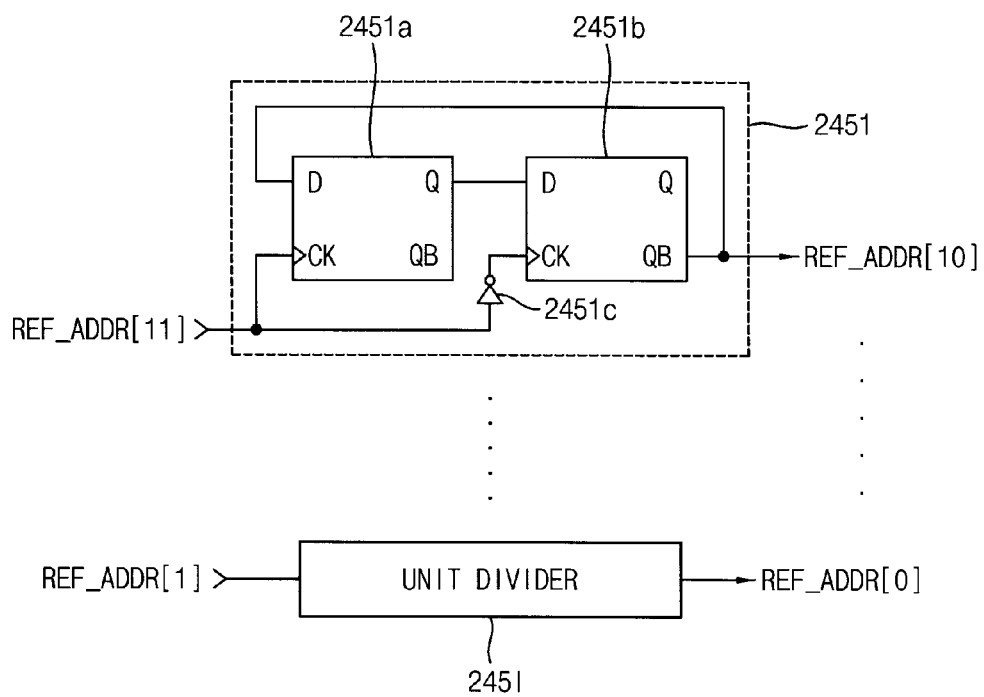
FIG. 9 is a circuit diagram illustrating the counting block according to example embodiments.

FIG. 9 is a circuit diagram illustrating the counting block according to example embodiments.

Referring to FIG. 9, the counting block 245 may include a plurality of unit dividers 2451~2451, where I is a natural number.

Each of the unit dividers 2451~2451 may generate respective bits of the rest bits of the abbreviated refresh row address REF_ADDR except the first bit REF_ADDR[12] and the second bit REF_ADDR[11]. Each of the unit dividers 2451~2451 may include a first D flip-flop 2451a, a second D flip-flop 2451b and an inverter 2451c. Each of the first and second D flip-flops 2451a and 2451b may include data terminal D, a clock terminal CK, an output terminal Q and an inverted output terminal QB. Each of the first and second D flip-flops 2451a and 2451b may be negative-edge triggered.

The output terminal Q of the first D flip-flop 2451a of the unit divider 2451 is coupled to the data terminal D of the second D flip-flop 2451b of the unit divider 2451 and the inverted output terminal QB of the second D flip-flop 2451b is coupled to the data terminal D of the first D flip-flop 2451a. The second bit REF_ADDR[11] is applied to the clock terminal CK of the first D flip-flop 2451a and inverted signal of the second bit REF_ADDR[11] is applied to the clock terminal of the second D flip-flop 2451b by the inverter 2451c of the unit divider 2451. The second D flip-flop 2451b may output a third bit REF_ADDR[10] successive to the second bit REF_ADDR[11] at the inverted output terminal QB of the second D flip-flop 2451b.

For the purpose of ease and convenience in explanation, only the unit divider 2451 of the unit dividers 2452~2451 will be described. The output terminal Q of the first D flip-flop 2451a of the unit divider 2451 is coupled to the data terminal D of the second D flip-flop 2451b of the unit divider 2451 and the inverted output terminal QB of the second D flip-flop 2451b is coupled to the data terminal D of the first D flip-flop 2451a. A REF_ADDR[1] is applied to the clock terminal CK of the first D flip-flop 2451a and inverted signal of the REF_ADDR[1] is applied to the clock terminal of the second D flip-flop 2451b by the inverter 2451c of the unit divider 2451. The second D flip-flop 2451b of the unit divider 2451 may output a REF_ADDR[0] successive to the REF_ADDR[1] at the inverted output terminal QB of the second D flip-flop 2451b.

Figure 10:
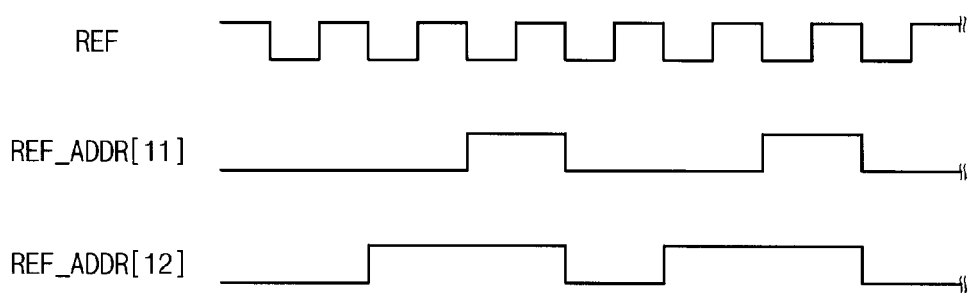
FIG. 10 is a waveform illustrating an operation of the refresh counter of FIG. 7 according to example embodiments.

FIG. 10 is a waveform illustrating an operation of the refresh counter of FIG. 7 according to example embodiments.

Figure 11:
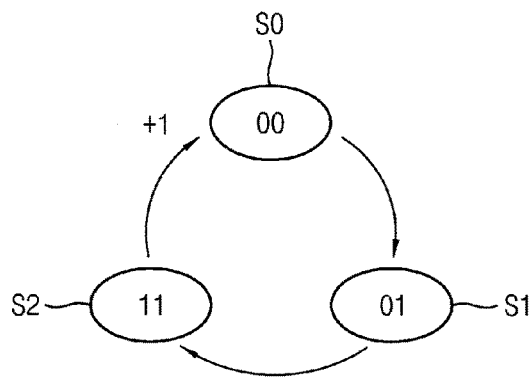
FIG. 11 illustrates state transitions of the refresh counter of FIG. 7 according to example embodiments.

FIG. 11 illustrates state transitions of the refresh counter of FIG. 7 according to example embodiments.

FIGS. 10 and 11 respectively illustrate an operation and state transitions of the first bit REF_ADDR[12] and the second bit REF_ADDR[11].

Figure 12:
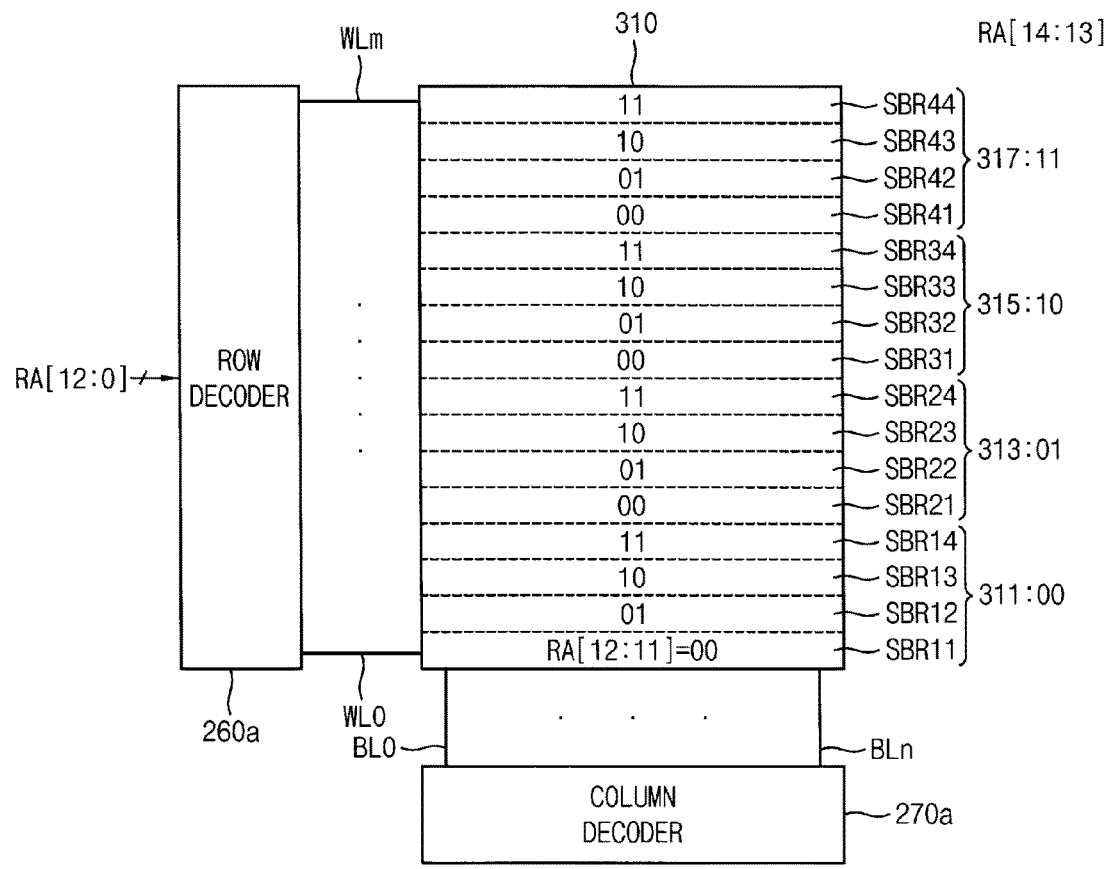
FIG. 12 illustrates a first bank in the semiconductor memory device of FIG. 3.

Referring to FIGS. 11 and 12, the refresh counter 240 may output the second bit REF_ADDR[11] and the first bit REF_ADDR[12] as the first state S0 corresponding to '00' in response to a first clock pulse of the refresh command REF, may output the second bit REF_ADDR[11] and the first bit REF_ADDR[12] as the second state S1 corresponding to '01' in response to a second clock pulse of the refresh command REF, and may output the second bit REF_ADDR[11] and the first bit REF_ADDR[12] as the third state S2 corresponding to '11' in response to a third clock pulse of the refresh command REF. The refresh counter 240 may increase one bit by generating the third bit REF_ADDR[10] after outputting the second bit REF_ADDR[11] and the first bit REF_ADDR[12] as the third state S2. The refresh counter 240 may output the second bit REF_ADDR[11] and the first bit REF_ADDR[12] as the first state S0 corresponding to '00' again in response to a fourth clock pulse of the refresh command REF.

FIG. 12 illustrates a first bank in the semiconductor memory device of FIG. 3.

Referring to FIGS. 3 and 12, a first bank 301 may include the first bank array 310, the row decoder 260a and the column decoder 270a.

The first bank array 310 may include a plurality of sub-arrays (or memory blocks) SBR11~SBR14, SBR21~SBR24, SBR31~SBR34 and SBR41~SBR44. Each sub-array of the plurality of sub-arrays SBR11~SBR14, SBR21~SBR24, SBR31~SBR34 and SBR41~SBR44 may include a plurality of memory cell rows (i.e., word lines). The sub-arrays SBR11~SBR14, SBR21~SBR24, SBR31~SBR34 and SBR41~SBR44 may be grouped into a plurality of sub-array groups 311, 313, 315 and 317 by at least one omitted bit RA[14:13] of the row address. Each of the sub-array groups 311, 313, 315 and 317 may include respective sub-arrays SBR11~SBR14, SBR21~SBR24, SBR31~SBR34 and SBR41~SBR44 which are designated by the first bit and the second bit RA[12:11]. Each of the sub-array groups 311, 313, 315 and 317 may be designed to share data I/O lines and data sense amplifier blocks. In one embodiment, at least two adjacent sub-arrays such as sub-arrays SBR11 and SBR12 of the sub-arrays SBR11~SBR14, sub-arrays SBR21 and SBR22 of the sub-arrays SBR21~SBR24, sub-arrays SBR31 and SBR32 of the sub-arrays SBR31~SBR34, and sub-arrays SBR41 and SBR42 of the sub-arrays SBR41~SBR44 do not share a bit line sense amplifier. Therefore, word lines coupled to memory cell rows belonging to other sub-arrays may be simultaneously selected when a refresh operation is performed. In one embodiment, a number of word lines in each sub-array of the sub-array SBR11~SBR44 may be $2^{11}$ word lines.

The row decoder 260a may select one or more word lines of a plurality of word lines WL0~WLm in response to a row address RA[12:0].

The column decoder 270a may select one or more bit lines of a plurality of bit lines BL0~BLn in response to a column address COL_ADDR'.

Figure 13:
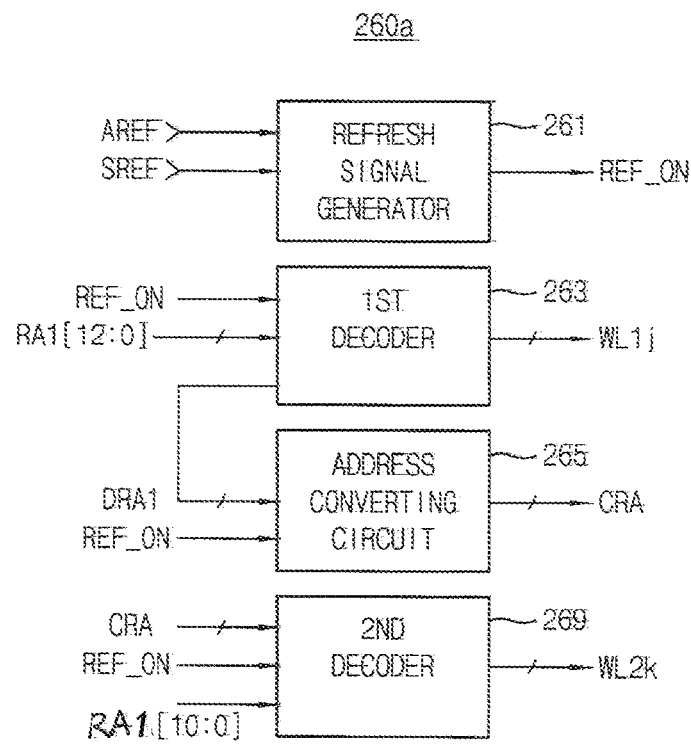
FIG. 13 illustrates a row decoder in FIG. 12 according to example embodiments.

FIG. 13 illustrates a row decoder in FIG. 12 according to example embodiments.

Referring to FIG. 13, the row decoder 260a may include a refresh signal generator 261, a first decoder 263, an address converting circuit 265 and a second decoder 269.

The refresh signal generator 261 may generate a refresh enable signal REF_ON in response to the refresh command such as an auto refresh command AREF or a self refresh command SREF. Hereinafter, it may be assumed that the refresh enable signal REF_ON may be activated (e.g., a high level or '1') when a semiconductor memory device is performing a refresh operation.

The first decoder 263 may be connected to the memory cell rows in first sub-array groups 311 and 313 in FIG. 12, which are designated by the at least one omitted bit RA[14] having a first level, i.e., a logic low level. The first decoder 263 may simultaneously select a first number of word lines of a plurality of word line signals WL1j in response to a selected refresh row address of an abbreviated refresh row addresses RA1[12:0] (e.g., a row address RA[12:0]), where j is a natural number greater than 1. The first decoder 263 may also generate a first decoded row address DRA1 for selecting multiple word lines in response to at least two upper bits (e.g., higher bits) from the abbreviated refresh row address RA1[12:0]. In one embodiment, the first decoded row address DRA1 may generate second and first bits DRAT [11:12] of the first decoded row address DRA1 in response to second and first bits RA1[11:12] of the abbreviated refresh row address RA1. Therefore, the first number of memory cell rows (e.g., word lines) in the first sub-array groups 311 and 313 may be selected in response to the selected refresh row address of the abbreviated refresh row address RA1[12:0] and the refresh enable signal REF_ON.

The address converting circuit 265 may receive the refresh enable signal REF_ON and the first decoded row address DRA1 to convert the first decoded row address DRA1 to a changed row address CRA based on the refresh enable signal REF_ON. The address converting circuit 265 may output the changed row address CRA by changing first and second bits of the first decoded row address DRA1.

The second decoder 269 may be connected to the memory cell rows in second sub-array groups 315 and 317 in FIG. 12, which are designated by the at least one omitted bit RA[14] having a second level, i.e., a logic high level. The second decoder 269 may simultaneously select a second number of word lines of a plurality of word line signals WL2k in response to the selected refresh row address of the abbreviated refresh row address RA1[12:0], where k is a natural number greater than 1. In one embodiment, the second number of memory cell rows (e.g., word lines) in the second sub-array groups 315 and 317 may be selected in response to an abbreviated refresh row address RA1[10:0], the changed row address CRA, and the refresh enable signal REF_ON.

Figure 14:
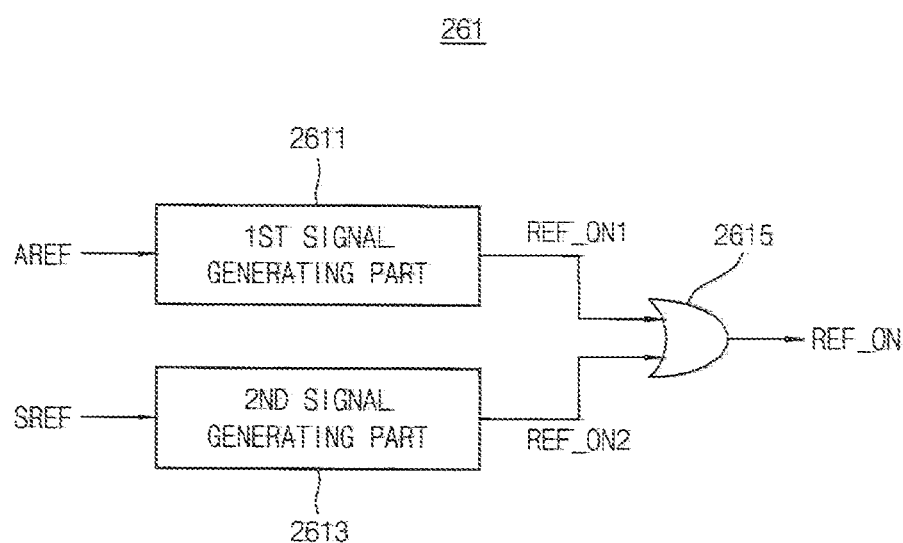
FIG. 14 illustrates the refresh signal generator in FIG. 13 according to example embodiments.

FIG. 14 illustrates the refresh signal generator in FIG. 13 according to example embodiments.

Referring to FIG. 14, the refresh signal generator 261 may include a first signal generating part 2611, a second signal generating part 2613 and an OR gate 2615.

The first signal generating part 2611 may generate a first refresh enable signal REF_ON1 when the refresh command REF is the auto refresh command AREF. The second signal generating part 2613 may generate a second refresh enable signal REF_ON2 when the refresh command REF is the self refresh command SREF. The OR gate 2615 may perform an OR operation on the first refresh enable signal REF_ON1 and the second refresh enable signal REF_ON2 to output the refresh enable signal REF_ON. The control logic circuit 210 in FIG. 3 may decode the command CMD from the memory controller 100 to provide the auto refresh command AREF to the row decoder 260a. The control logic circuit 210 in FIG. 3 may decode a stand-by command to provide the self refresh command SREF to the row decoder 260a when the semiconductor memory device 200a enters into a stand-by mode.

Figure 15:
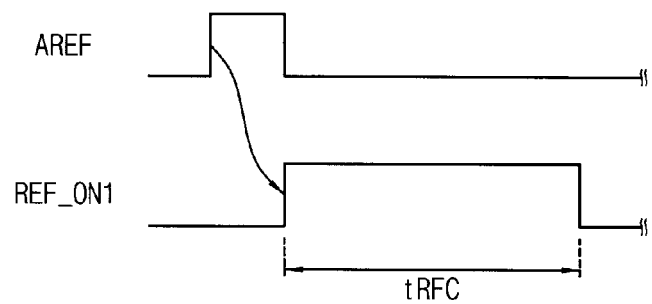
FIG. 15 is a waveform illustrating a first refresh enable signal.

FIG. 15 is a waveform illustrating a first refresh enable signal.

Referring to FIGS. 14 and 15, the first signal generating part 2611 generates the first refresh enable signal REF_ON1 in response to the auto refresh command AREF. The first refresh enable signal REF_ON1 may be activated in delayed synchronization with a rising edge of the auto refresh command AREF and may be activated during a refresh cycle tRFC defined in a specification.

Figure 16:
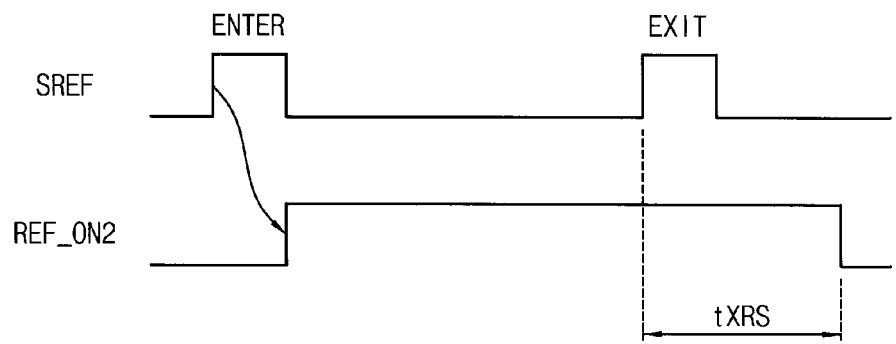
FIG. 16 is a waveform illustrating a second refresh enable signal.

FIG. 16 is a waveform illustrating a second refresh enable signal.

Referring to FIGS. 14 and 16, the second signal generating part 2613 generates the second refresh enable signal REF_ON2 in response to the self refresh command SREF. The second refresh enable signal REF_ON2 may be activated in synchronization with a rising edge of entry of the self refresh command SREF, may be deactivated after exit from a self refresh defined in a specification and a next valid command delay time tXSR.

Figure 17:
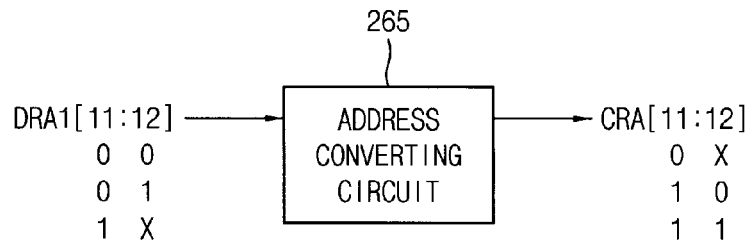
FIG. 17 illustrates an operation of an address converting circuit in the row decoder of FIG. 13.

FIG. 17 illustrates an operation of the address converting logic circuit in the row decoder of FIG. 13.

Referring to FIG. 17, when second bit and the first bit DRA1[11:12] of the first decoded row address DRA1 is '00', the address converting circuit 265 may output a second bit and a first bit CRA[11:12] of the changed row address CRA to '0X', where 'X' denotes don't care bit, when the second bit and the first bit DRA1[11:12] of the first decoded row address DRA1 is '01', the address converting circuit 265 may output the second bit and the first bit CRA[11:12] of the changed row address CRA to '10', and when the second bit and the first bit DRA1[11:12] of the first decoded row address DRA1 is '1X', the address converting circuit 265 may output the second bit and the first bit CRA[11:12] of the changed row address CRA to '11'.

Figure 18:
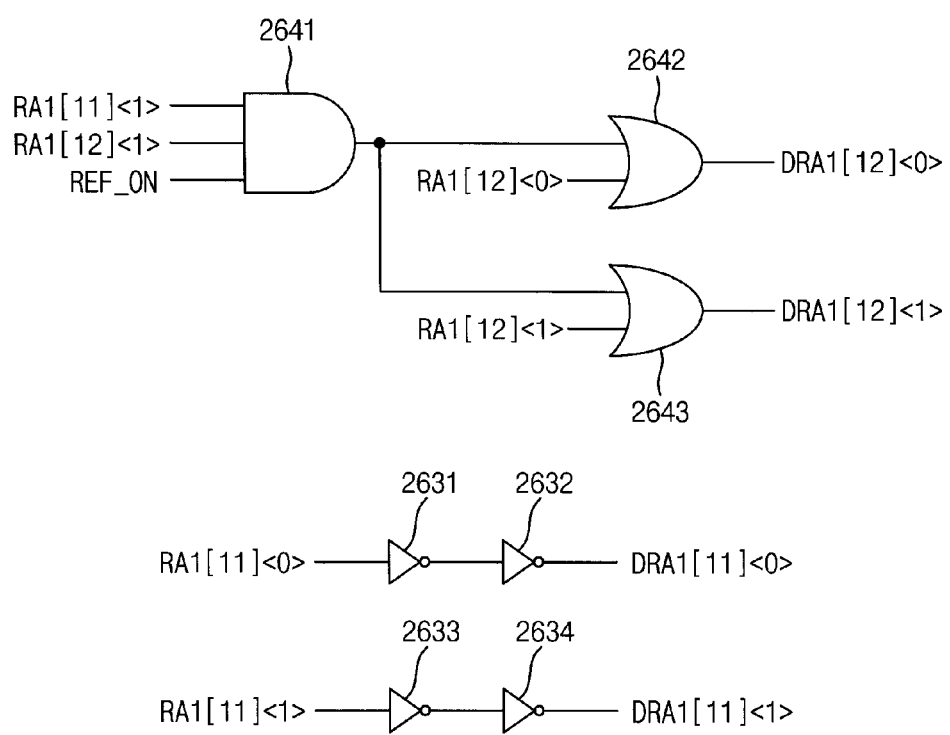
FIG. 18 illustrates an address coding circuit that is included in the first decoder in FIG. 13.

FIG. 18 illustrates an address coding circuit that is included in the first decoder in FIG. 13.

In one embodiment, the address coding circuit 264 in the first decoder 263 may convert the second bit and the first bit RA1[11:12] of the abbreviated refresh row address RA1 to the second and first bits DRA1[11:12] of the first decoded row address DRAT as '1X', when the second bit and the first bit RA1[11:12] of the abbreviated refresh row address RA1 is '11' and may output without conversion the second bit and the first bit RA1[11:12] of the abbreviated refresh row address RA1 when the second bit and the first bit RA1[11:12] of the abbreviated refresh row address RA1 is '00' or '01'. Therefore, the first decoder 263 may include an address coding circuit 264 that converts the second bit and the first bit RA1[11:12] of the abbreviated refresh row address RA1 to '1X', when the second bit and the first bit RA1[11:12] of the abbreviated refresh row address RA1 is '11'.

In one embodiment, a first buffer (not shown) in the first decoder 263 may generate first buffered bits RA1[12]<0> and RA1[12]<1> of the abbreviated refresh row address RA1 based on the first bit RA1[12] of the abbreviated refresh row address RA1. A second buffer (not shown) in the first decoder 263 may generate second buffered bits RA1[11]<0> and RA1[11]<1> of the abbreviated refresh row address RA1 based on the second bit RA1[11] of the abbreviated refresh row address RA1. For example, in one embodiment, the first buffered bit RA1[12]<0> is '1' or '0' when the first bit RA1[12] of the refresh row address is input as '0' or '1', respectively. The first buffered bit RA1[12]<1> is '1' or '0' when the first bit RA1[12] of the refresh row address is input as '1' or '0', respectively. Similarly, the second buffered bit RA1[11]<0> is '1' or '0' when the second bit RA1[11] of the refresh row address is input as '0' or '1', respectively. The second buffered bit RA1[11]<1> is '1' or '0' when the second bit RA1[11] of the refresh row address is input as '1' or '0', respectively. In one embodiment, the first bit DRA1 [12] of the first decoded row address DRA1 may include first decoded bits DRA1[12]<0> and DRA1 [12]<1>. The second bit DRA1 [11] of the first decoded row address DRA1 may include second decoded bits DRA1[11]<0> and DRA1[11]<1>.

Referring to FIG. 18, the address coding circuit 264 may include inverters 2631~2634, an AND gate 2641 and OR gates 2642~2644. In one embodiment, the inverter 2631 and inverter 2632 are connected to each other in series, the inverter 2631 receives the second buffered bit RA1[11]<0> of the abbreviated refresh row address RA1 and the inverter 2632 outputs the second decoded bit DRA1[11]<0> of the first decoded row address DRA1. The inverter 2633 and inverter 2634 are connected to each other in series, the inverter 2633 receives the second buffered bit RA1[11]<1> of the abbreviated refresh row address RA1 and the inverter 2634 outputs a second decoded bit DRA1[11]<1> of the first decoded row address DRA1. Therefore, a logic value of each of the second decoded bits DRA1[11]<0> and DRA1[11]<1> of the first decoded row address DRA1 is the same as a logic value of each of the second buffered bits RA1[11]<0> and RA1[11]<1> of the abbreviated refresh row address RA1. The AND gate 2641 receives the refresh enable signal REF_ON and the second and first buffered bits RA1[11]<1> and RA1[12]<1> of the abbreviated refresh row address RA1. The OR gate 2642 receives an output of the AND gate 2641 and the first buffered bit RA1[12]<0> of the abbreviated refresh row address RA1 to output the first decoded bit DRA1[12]<0> of the first decoded row address DRA1. The OR gate 2643 receives the output of the AND gate 2641 and the first buffered bit RA1[12]<1> of the abbreviated refresh row address RA1 to output the first decoded bit DRA1[12] <1> of the first decoded row address DRA1. For example, the OR gate 2642 may output the first decoded bit DRA1 [12]<0> of the first decoded row address DRA1 as '1' and the OR gate 2643 may output the first decoded bit DRA1 [12]<1> of the first decoded row address DRA1 as '1' when each of the second buffered bit RA1[11]<1> and the first buffered bit RA1[12]<1> and the refresh enable signal REF_ON is '1'. The OR gate 2642 may output the first buffered bit RA1[12]<0> of the abbreviated refresh row address RA1 as '1' when the first decoded bit DRA1[12]<0> of the first decoded row address DRA1 is '1'. The OR gate 2642 may output the first buffered bit RA1[12]<1> of the abbreviated refresh row address RA1 as '1' when the first decoded bit DRAT [12]<1> of the first decoded row address DRA1 is '1' and the second decoded bit DRAT [11]<0> of the first decoded row address DRA1 is '1'.

Therefore, the address coding circuit 264 may generate respectively the second and first decoded bits DRA1[11] <0>, DRA1[11]<1>, DRA1[12]<0>, and DRA1[12]<1> of the first decoded row address DRA1 based on the second and first buffered bits RA1[11]<0>, RA1[11]<1>, RA1[12]<0>, and RA1[12]<1> of the abbreviated refresh row address RA1. For example, if the second and first bits RA1 [11:12] of the abbreviated refresh row address RA1 are '00', '01', and '11,' the second and first bits DRA1[11:12] of the first decoded row address DRA1 are '00', '01', and '1X'. The output of the AND gate 2641 is maintained at a high level while the refresh enable signal REF_ON is activated (e.g., a high level), and each of the first decoded bit DRA1[12]<1> and the second decoded bit DRA1[11]<1> of the first decoded row address DRA1 is a high level without regard to a logic level of the first bit RA1 [12] of the abbreviated refresh row address RA1.

Figure 19:
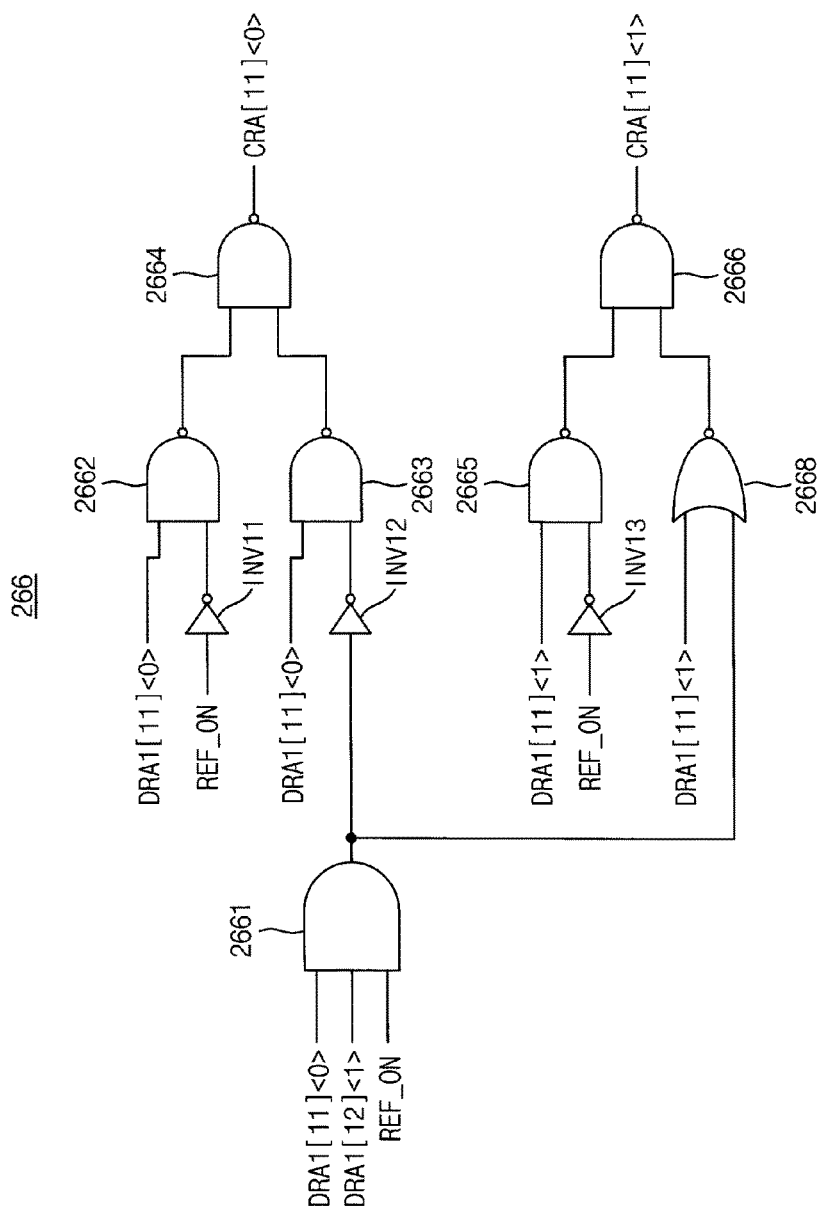
FIG. 19 illustrates a second bit converting circuit that is included in the address converting circuit in FIG. 13 according to example embodiments.

FIG. 19 illustrates a second bit converting circuit that is included in the address converting circuit in FIG. 13 according to example embodiments.

Referring to FIG. 19, a second bit converting circuit 266 may include an AND gate 2661, NAND gates 2662~2666, inverters INV11~INV13, and NOR gate 2668.

In one embodiment, the changed row address CRA may include second and first bits CRA[11:12], and the first bit CRA[12] of the changed row address CRA may include first buffered bit CRA[12]<0> and CRA[12]<1> of the of the changed row address CRA. Similarly, the second bit CRA [11] of the changed row address CRA may include first buffered bit CRA[11]<0> and CRA[11]<1> of the changed row address CRA.

The AND gate 2661 receives the refresh enable signal REF_ON, the first buffered bit DRA[12]<1> and the second buffered bit DRA[11]<0> of the first decoded row address DRA1. The NAND gate 2662 receives the second buffered bit DRA[11]<0> of the first decoded row address DRA1 and an inverted signal of the refresh enable signal REF_ON by the inverter INV11. The NAND gate 2663 receives the second buffered bit DRA[11]<0> of the first decoded row address DRA1 and an inverted signal of an output of the AND gate 2661 by the inverter INV12. The NAND gate 2664 receives outputs of the NAND gates 2662 and 2663 and outputs the second buffered bit CRA[11]<0> of the changed row address CRA.

The NAND gate 2665 receives the second bit DRA[11] <1> of the first decoded row address DRA1 and the inverted signal of the refresh enable signal REF_ON by the inverter INV13. The NOR gate 2668 receives the second bit DRA [11]<1> of the first decoded row address DRA1 and the output of the AND gate 2661. The NAND gate 2666 receives outputs of the NAND gate 2665 and the NOR gate 2668 and outputs the second bit CRA[11]<1> of the changed row address CRA.

Therefore, in one embodiment, the second buffered bit CRA[11]<0> of the changed row address CRA is '1' when each of the second decoded bit DRA[11]<0> and the first decoded bit DRA[12]<0> of the first decoded row address DRA1 is '1'. The second buffered bit CRA[11]<1> of the changed row address CRA is '1' when each of the second decoded bit DRA[11]<0> and the first decoded bit DRA[12] <1> of the first decoded row address DRA1 is '1'. Also, the second buffered bit CRA[11]<1> of the changed row address CRA is '1' when each of the second decoded bit DRA[11] <1> of the first decoded row address DRA1 regardless of a state of each of the first decoded bits DRA[12]<0> and DRA[12]<1> of the first decoded row address DRA1.

Figure 20:
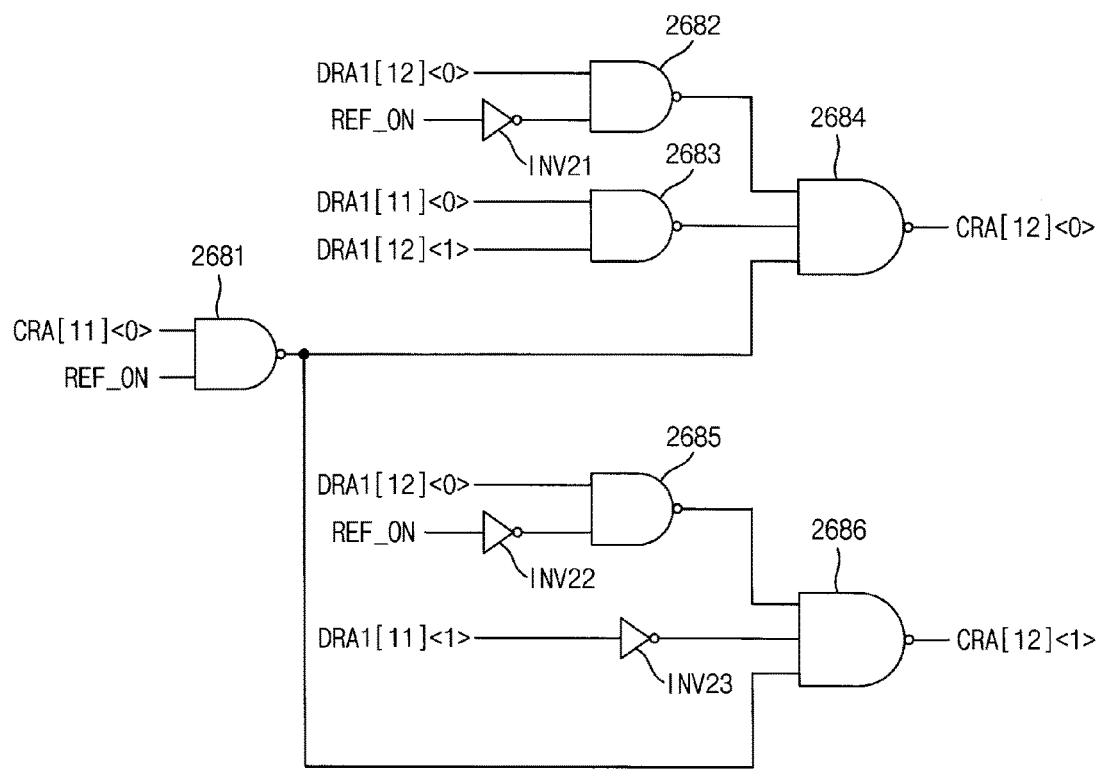
FIG. 20 illustrates a first bit converting part that is included in the address converting circuit in FIG. 13 according to example embodiments.

FIG. 20 illustrates a first bit converting circuit that is included in the address converting circuit in FIG. 13 according to example embodiments.

Referring to FIG. 20, a first bit converting circuit 268 may include NAND gates 2681~2686, and inverters INV21~INV23.

The NAND gate 2681 receives the refresh enable signal REF_ON and the second buffered bit CRA[11]<0> of the changed row address CRA. The NAND gate 2682 receives the first decoded bit DRA[12]<0> of the first decoded row address DRA1 and the inverted signal of the refresh enable signal REF_ON by the inverter INV21. The NAND gate 2683 receives the second decoded bit DRA[11]<0> of the first decoded row address DRA1 and the first decoded bit DRA[12]<1> of the first decoded row address DRAT. The NAND gate 2684 receives outputs of the NAND gates 2681, 2682 and 2683 and outputs the first buffered bit CRA[12] <0> of the changed row address CRA.

The NAND gate 2685 receives the first decoded bit DRA[12]<0> of the first decoded row address DRA1 and the inverted signal of the refresh enable signal REF_ON by the inverter INV22. The inverter INV23 receives the second bit DRA[11]<1> of the first decoded row address DRAT. The NAND gate 2686 receives outputs of the NAND gates 2681 and 2685 and the inverter INV23 and outputs the first buffered bit CRA[12]<1> of the changed row address CRA.

For example, in one embodiment, both of the first buffered bit CRA[12]<0> of the changed row address CRA and the first buffered bit CRA[12]<1> of the changed row address CRA are '1' when each of the second buffered bit CRA[11] <0> of the changed row address CRA and the refresh enable signal REF_ON is '1'. The first buffered bit CRA[12]<0> of the changed row address CRA is '1' when both of the second decoded bit DRA[11]<0> and the first decoded bit DRA[12] <1> of the first decoded row address DRA1 are '1'. The first buffered bit CRA[12]<1> of the changed row address CRA is '1' when both of the second decoded bit DRA[11]<1> of the first decoded row address DRA1 and the refresh enable signal REF_ON is '1' regardless of a state of each of the first decoded bit DRA[12]<1> and the first decoded bit DRA [12]<0> of the first decoded row address DRA1.

Therefore, the address converting circuit 265 may output the second and first bits CRA[11:12] of the changed row address CRA as '0X' when the second and first bits DRAT [11:12] of the first decoded row address DRA1 is '00', may output the second and first bits CRA[11:12] of the changed row address CRA as '10' when the second and first bits DRAT [11:12] of the first decoded row address DRA1 is '01' and may output the second and first bits CRA[11:12] of the changed row address CRA as '11' when the second and first bits DRA1[11:12] of the first decoded row address DRA1 is '1X'.

Figure 21:
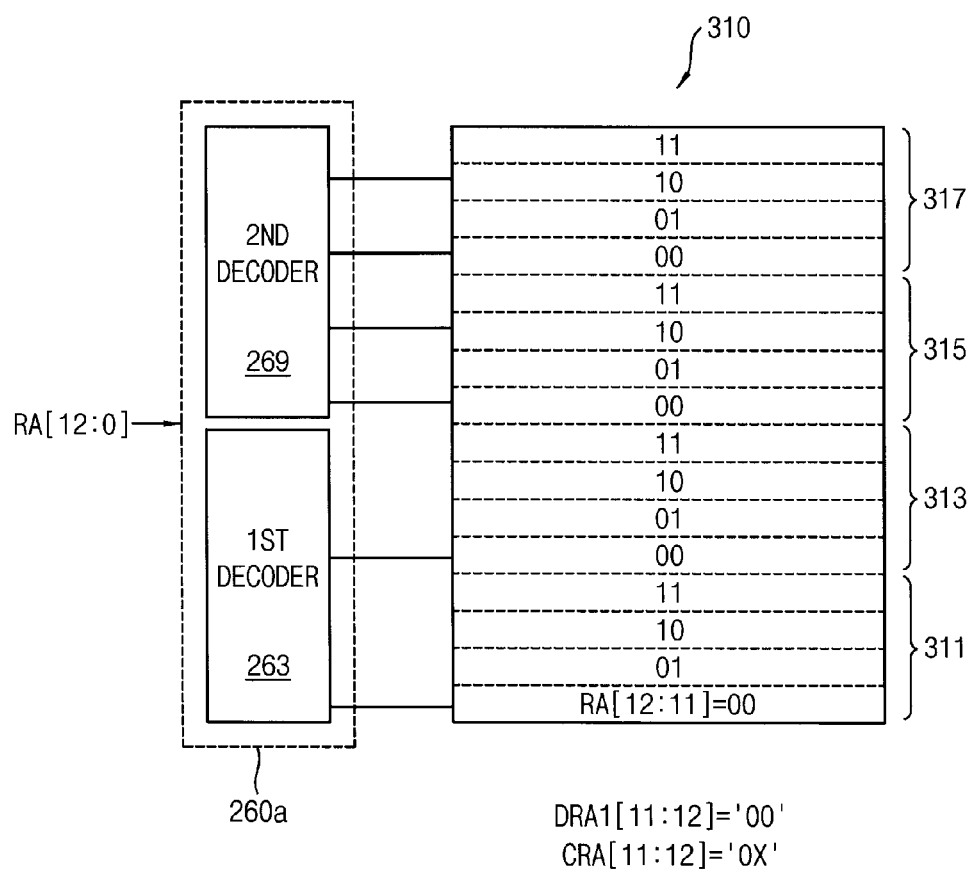
FIGS. 21 through 23 illustrate respectively a refresh operation in the first bank of FIG. 12 based on the abbreviated refresh row address according to example embodiments.
Figure 22:
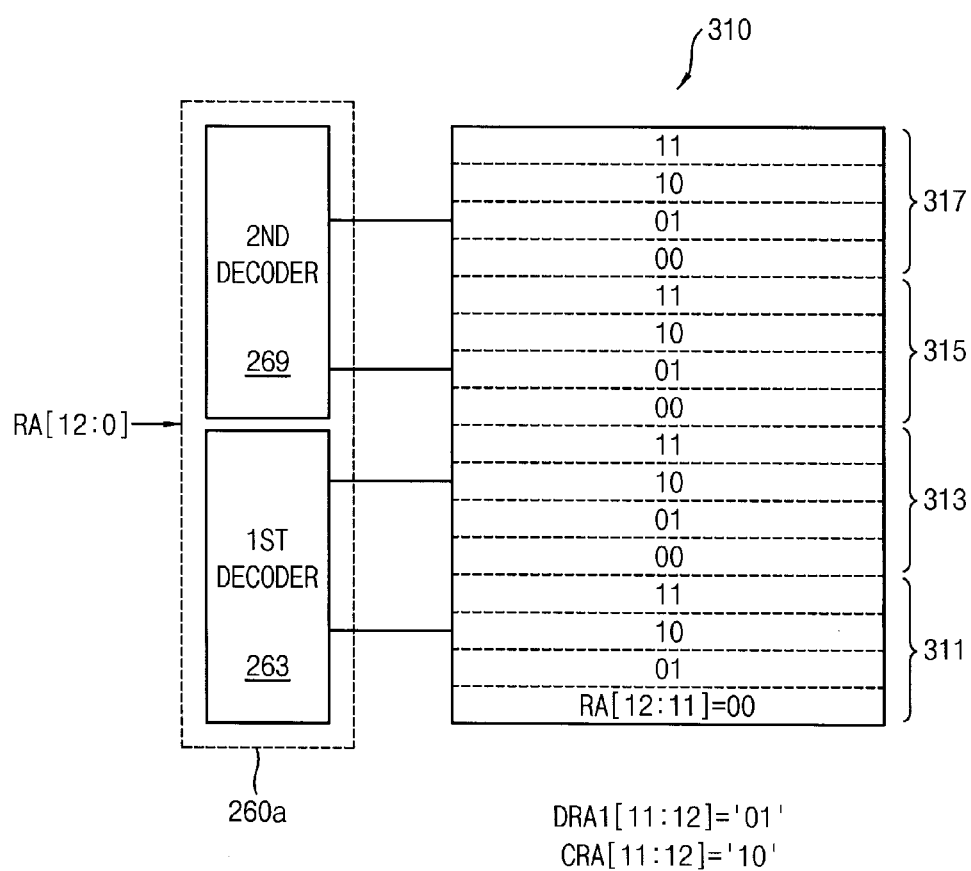
Figure 23:
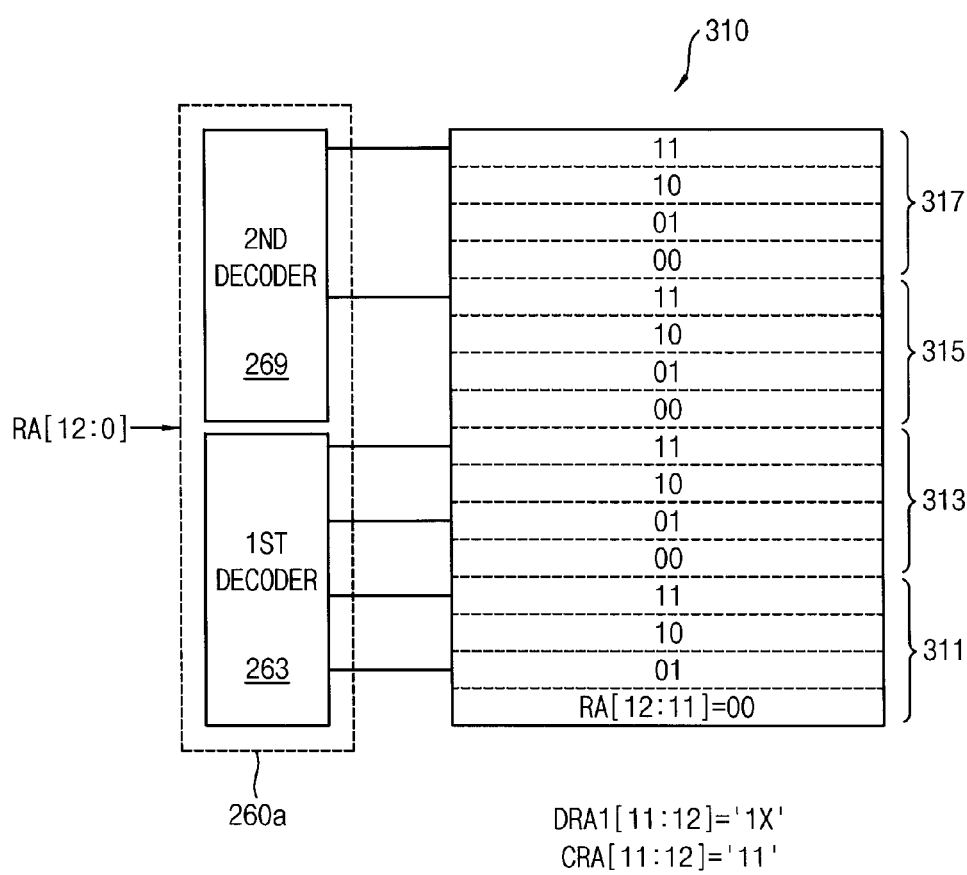

FIGS. 21 through 23 illustrate respectively a refresh operation in the first bank of FIG. 12 based on the abbreviated refresh row address according to example embodiments.

Referring to FIG. 21, since the address converting circuit 265 may output the second and first bits CRA[11:12] of the changed row address CRA as '0X' when the second and first bits DRA1 [11:12] of the first decoded row address DRA1 is '00', the first decoder 263 may simultaneously select two word lines in the first sub-array groups 311 and 313 in response to one refresh command REF based on the selected refresh row address. The second decoder 269 may simultaneously select four word lines in the second sub-array groups 315 and 317 in response to the second and first bits CRA[11:12] of the changed row address CRA and one refresh command REF based on the selected refresh row address. For example, six word lines may be simultaneously selected in response to one refresh command in FIG. 21.

Referring to FIG. 22, since the address converting circuit 265 may output the second and first bits CRA[11:12] of the changed row address CRA as '10' when the second and first bits DRA1 [11:12] of the first decoded row address DRA1 is '01', the first decoder 263 may simultaneously select two word lines in the first sub-array groups 311 and 313 in response to one refresh command REF based on the selected refresh row address. The second decoder 269 may simultaneously select two word lines in the second sub-array groups 315 and 317 in response to one refresh command REF. For example, four word lines may be simultaneously selected in response to one refresh command in FIG. 22.

Referring to FIG. 23, since the address converting circuit 265 may output the second and first bits CRA[11:12] of the changed row address CRA as '11' when the second and first bits DRA1 [11:12] of the first decoded row address DRA1 is '1X', the first decoder 263 may simultaneously select four word lines in the first sub-array groups 311 and 313 in response to the second and first bits DRA1[11:12] of the first decoded row address DRA1 and one refresh command REF based on the selected refresh row address. The second decoder 269 may simultaneously select two word lines in the second sub-array groups 315 and 317 in response to one refresh command REF based on the selected refresh row address. For example, six word lines may be simultaneously selected in response to one refresh command in FIG. 23.

In FIGS. 21 through 23, the abbreviated refresh row address RA[12:0] may be also referred to as a set of row address signals. For example, in FIGS. 21 through 23, the first decoder 263 may be configured to simultaneously perform a refresh on a first number of memory cell rows of the memory cell rows (e.g., word lines) in the bank array 310, based on a selected refresh row address of a set of refresh row addresses RA[12:0] and the second decoder 263 may be configured to simultaneously perform a refresh on a second number of memory cell rows of the memory cell rows in the bank array 310, based on the selected refresh row address. A total number of the first number of rows and the second number of rows may be varied in response to the selected refresh row address. The first number of rows is smaller than the second number of rows in FIG. 21, the first number of rows is the same as the second number of rows in FIG. 22 and the first number of rows is greater than the second number of rows in FIG. 23. In FIGS. 21 through 23, the first number of memory cell rows and the second number of the memory cell rows may be simultaneously selected to perform a refresh.

Figure 24:
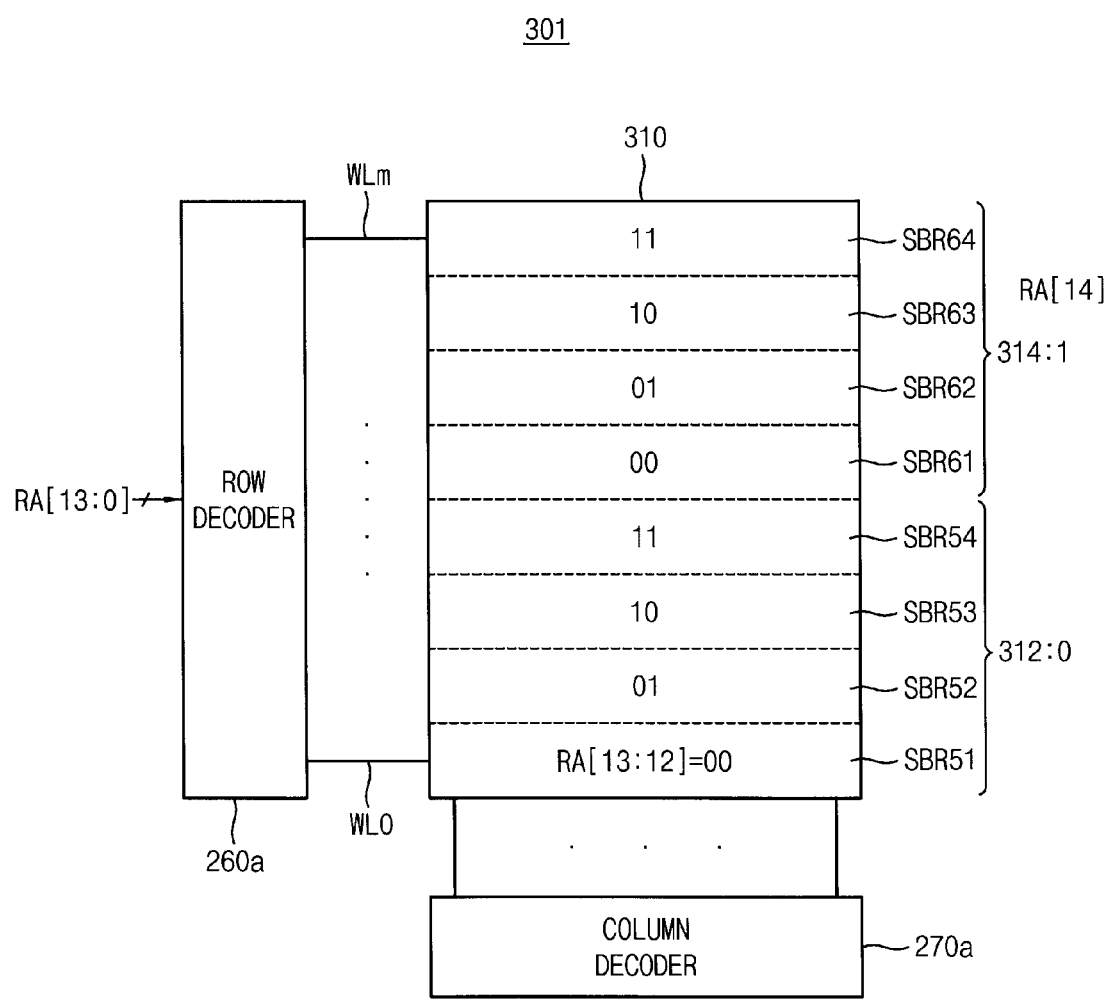
FIG. 24 illustrates a first bank in the semiconductor memory device of FIG. 3 according to example embodiments.

FIG. 24 illustrates a first bank in the semiconductor memory device of FIG. 3 according to example embodiments.

Referring to FIGS. 3 and 24, a first bank 301 may include the first bank array 310, the row decoder 260a and the column decoder 270a.

The first bank array 310 may include a plurality of sub-arrays (or memory blocks) SBR51~SBR54 and SBR61~SBR64. Each sub-array of the plurality of sub-arrays SBR51~SBR54 and SBR61~SBR64 may include a plurality of memory cell rows (i.e., word lines). The sub-arrays SBR51~SBR54 and SBR61~SBR64 may be grouped into a plurality of sub-array groups 312 and 314 by at least one omitted bit RA[14] of the row address. Each of the sub-array groups 312 and 314 may include respective sub-arrays SBR51~SBR54 and SBR61~SBR64 which are designated by the first bit and the second bit RA[13:12]. Each of the sub-array groups 312 and 314 may be designed to share data I/O lines and data sense amplifier blocks. At least two sub-arrays such as sub-arrays SBR51 and SBR52 of the sub-arrays SBR51~SBR54, and sub-arrays SBR61 and SBR62 of the sub-arrays SBR61~SBR64 may not share a bit line sense amplifier. Therefore, word lines coupled to memory cell rows belonging to other sub-arrays may be simultaneously selected when a refresh operation is performed. In one embodiment, a number of word lines in each sub-array of the sub-array SBR51~SBR64 may be $2^{12}$ word lines.

In FIG. 24 compared with FIG. 12, the at least one omitted bit is reduced to one bit from two bits and each of the sub-arrays SBR51~SBR54 and SBR61~SBR64 may include memory cell rows two times more than each of the sub-arrays SBR11~SBR14, SBR21~SBR24, SBR31~SBR34 and SBR41~SBR44.

Figure 25:
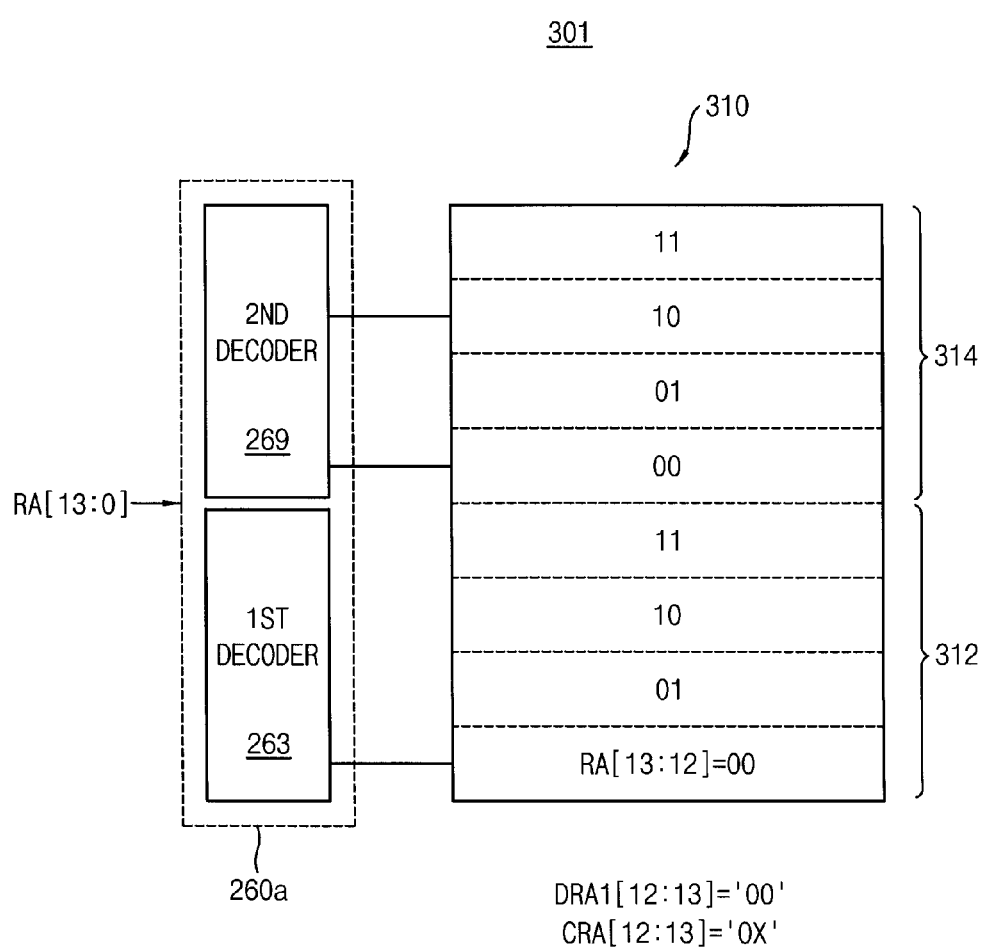
FIGS. 25 through 27 illustrate respectively a refresh operation in the first bank of FIG. 24 based on the abbreviated refresh row address according to example embodiments.
Figure 26:
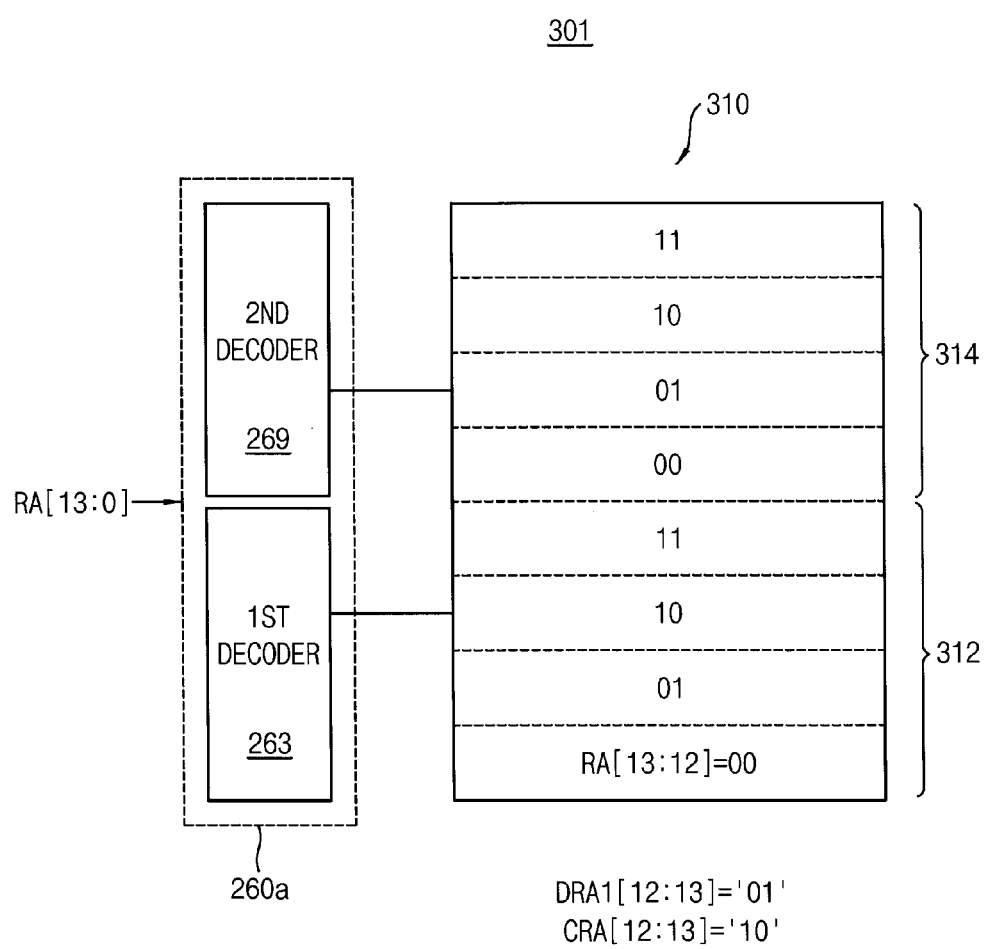
Figure 27:
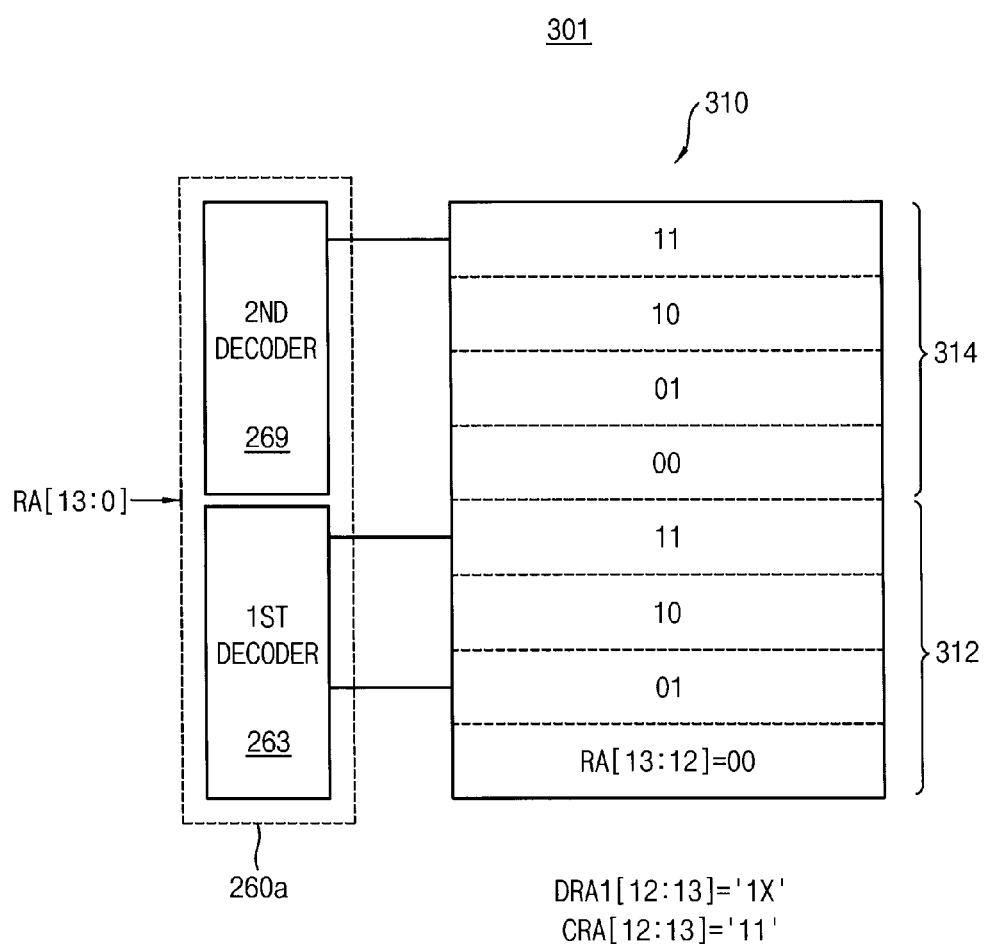

FIGS. 25 through 27 illustrate respectively a refresh operation in the first bank of FIG. 24 based on the abbreviated refresh row address according to example embodiments.

Referring to FIG. 25, since the address converting circuit 265 may output the second and first bits CRA[12:13] of the changed row address CRA as '0X' when the second and first bits DRA1[12:13] of the first decoded row address DRAT is '00', the first decoder 263 may select one word line in the first sub-array group 312 in response to one refresh command REF based on the selected refresh row address. The second decoder 269 may simultaneously select two word lines in the second sub-array group 314 in response to the second and first bits CRA[12:13] of the changed row address CRA and one refresh command REF based on the selected refresh row address. For example, three word lines may be simultaneously selected in response to one refresh command in FIG. 25.

Referring to FIG. 26, since the address converting circuit 265 may output the second and first bits CRA[12:13] of the changed row address CRA as '10' when the second and first bits DRA1[12:13] of the first decoded row address DRA1 is '01', the first decoder 263 may select one word line in the first sub-array group 312 in response to one refresh command REF based on the selected refresh row address. The second decoder 269 may select one word line in the second sub-array group 314 in response to one refresh command REF based on the selected refresh row address. For example, two word lines may be simultaneously selected in response to one refresh command in FIG. 26.

Referring to FIG. 27, since the address converting circuit 265 may output the second and first bits CRA[12:13] of the changed row address CRA as '11' when the second and first bits DRA1[12:13] of the first decoded row address DRA1 is '1X', the first decoder 263 may simultaneously select two word lines in the first sub-array group 312 in response to the second and first bits DRA1[12:13] of the first decoded row address DRA1 and one refresh command REF based on the selected refresh row address. The second decoder 269 may select one word line in the second sub-array group 314 in response to one refresh command REF based on the selected refresh row address. For example, three word lines may be simultaneously selected in response to one refresh command in FIG. 27.

The refresh counter 240 of FIGS. 3, 7, 8, and 9 may output abbreviated row address by sequentially counting first through third states repeatedly, the row decoder 260a may vary a number of word lines that are simultaneously selected according to states of upper first and second bits of the abbreviated refresh row address. As a number of omitted bits in a row address designating one memory cell row increases, a number of word lines that are simultaneously selected also increases as described with reference to FIGS. 7 through 27.

In addition, a number of word lines that are simultaneously selected may correspond to a value between two's multiples, increase of power consumption and noise may be prevented.

The refresh counter 240 may generate an r-bit abbreviated refresh row address obtained by omitting at least one bit of q bits from a p-bit address for selecting a number of memory cell rows, where q is a natural number greater than zero, r is a natural number greater than q and p=q+r. The row decoder 260a may vary a number of word lines that are simultaneously selected according to states of upper first and second bits of the r-bit abbreviated refresh row address. In addition, a plurality of sub-arrays in the bank of FIGS. 12 and 24 may be grouped into at least a first sub-array group and a second sub-array group by a most significant bit (MSB) of the omitted q bits. The first sub-array group may be designated by the MSB of the omitted q bits with a first level and the second sub-array group may be designated by the MSB of the omitted q bits with a second level.

When the refresh counter 240 output the second and first bits of the r-bit abbreviated refresh row address as '00', the first decoder 263 may simultaneously enable $2^{q-1}$ word lines in the at least one first sub-array group and the second decoder 269 may simultaneously select $2^q$ word lines in the at least one second sub-array group. Therefore, the row decoder 260a may simultaneously enable $3*2^{q-1}$ word lines when the refresh counter 240 output the second and first bits of the r-bit abbreviated refresh row address as '00'.

When the refresh counter 240 output the second and first bits of the r-bit abbreviated refresh row address as '01', the first decoder 263 may simultaneously select $2^{q-1}$ word lines in the at least one first sub-array group and the second decoder 269 may simultaneously select $2^{q-1}$ word lines in the at least one second sub-array group. Therefore, the row decoder 260a may simultaneously select $2^q$ word lines when the refresh counter 240 output the second and first bits of the r-bit abbreviated refresh row address as '01'.

When the refresh counter 240 output the second and first bits of the r-bit abbreviated refresh row address as '11', the first decoder 263 may simultaneously select $2^q$ word lines in the at least one first sub-array group and the second decoder 269 may simultaneously select $2^{q-1}$ word lines in the at least one second sub-array group. Therefore, the row decoder 260a may simultaneously select $3*2^{q-1}$ word lines when the refresh counter 240 output the second and first bits of the r-bit abbreviated refresh row address as '11'.

Figure 28A:
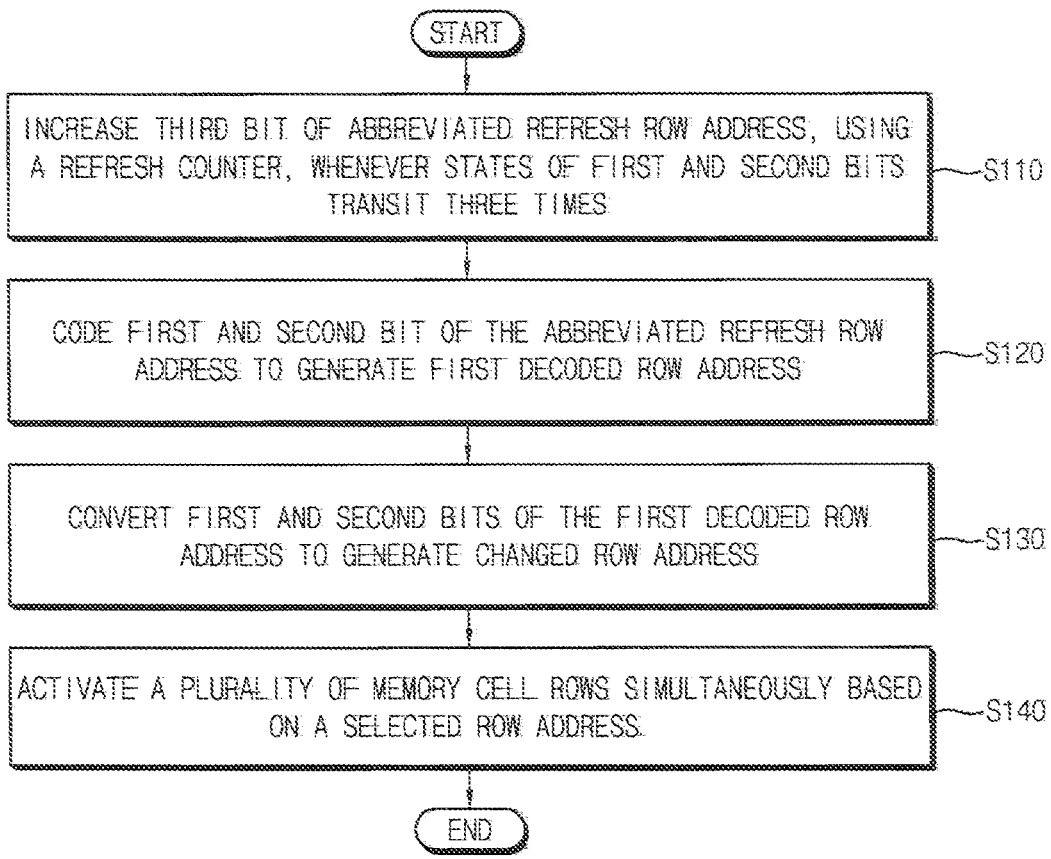
FIG. 28A is a flow chart illustrating a method of refreshing a semiconductor memory device according to example embodiments.

FIG. 28A is a flow chart illustrating a method of performing a refresh operation for a semiconductor memory device according to example embodiments.

Referring to FIGS. 3 through 28A, there will be description on a method of performing a refresh operation for a semiconductor memory device according to example embodiments.

Whenever states of the first and second bits transit three times, for example, each time being in response to a refresh command, a third bit (e.g., one of the other bits, other than the first and second bit, of the abbreviated refresh row address RA[12:0]) increases (S110). This counting procedure may be used for simultaneously selecting at least some of the memory cell rows in the memory cell array 300 of the semiconductor memory device 200a, and may be performed, for example, by a counter such as a refresh counter 240. A first decoded row address DRA1 is generated by coding the first and second bits of the abbreviated refresh row address RA[12:0] in a first decoder 263 of the row decoder 260a (S120). A changed row address CRA is generated by converting the first and second bits of the first decoded row address DRA1 (S130). A plurality of memory cell rows in the bank array 310 are simultaneously selected based on a selected refresh row address (S140).

Figure 28B:
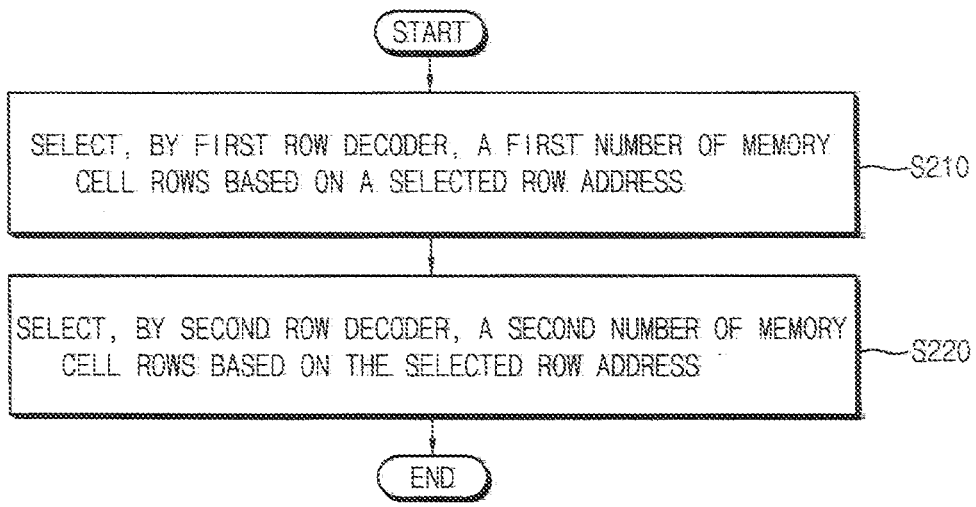
FIG. 28B is a flow chart illustrating a method of refreshing a semiconductor memory device according to example embodiments.

FIG. 28B is a flow chart illustrating a method of performing a refresh operation for a semiconductor memory device according to example embodiments.

Referring to FIGS. 21 through 23, 25 through 27 and 28B, the first decoder 263 is configured to select a first number of memory cell rows in the bank array 310 based on a selected refresh row address of a set of row addresses RA[12:0] (S210). The second decoder 269 is configured to select a second number of memory cell rows in the bank array 310 based on the selected refresh row address (S220). A total number of the first number of rows and the second number of rows may be varied based on the selected refresh row address.

Figure 29:
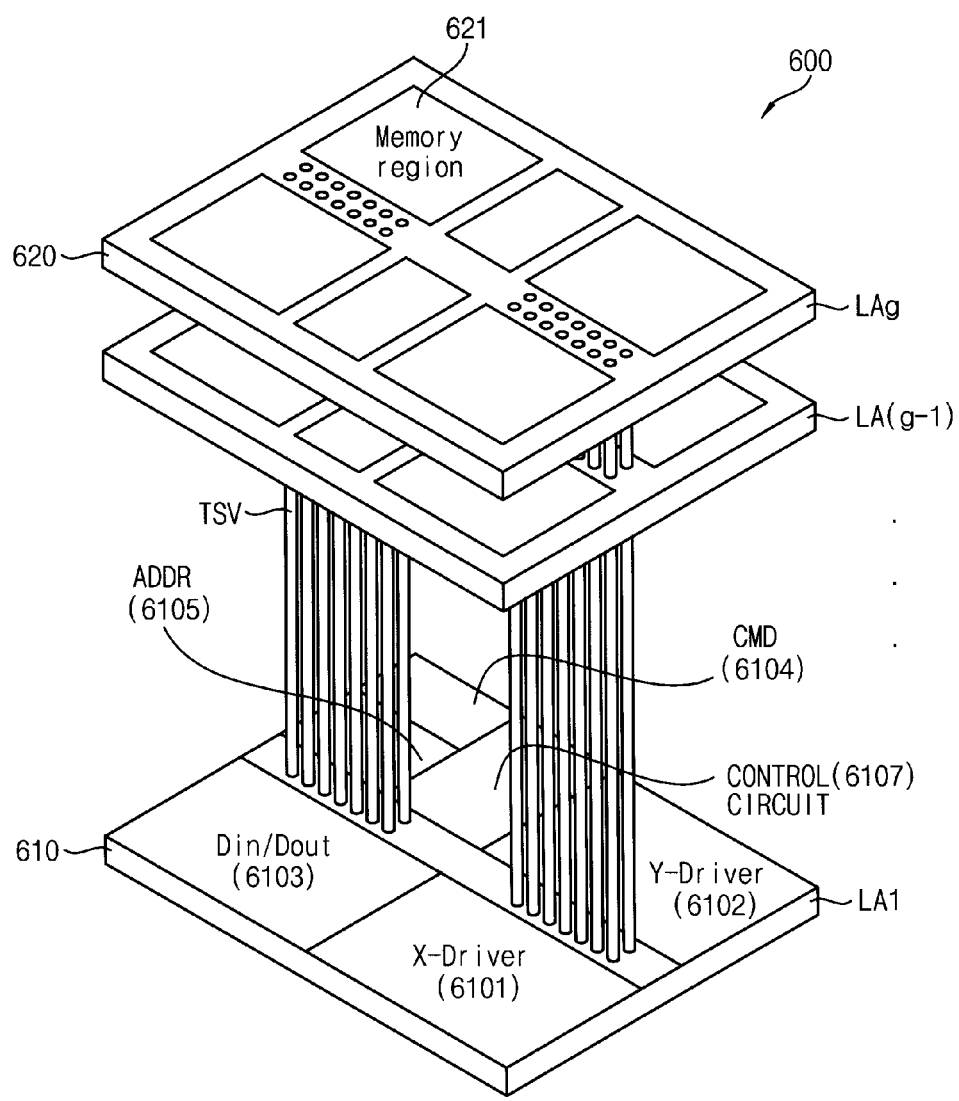
FIG. 29 is a structural diagram illustrating a semiconductor memory device according to example embodiments.

FIG. 29 is a structural diagram illustrating a semiconductor memory device according to example embodiments.

Referring to FIG. 29, a semiconductor memory device 600 may include first through gth semiconductor integrated circuit layers LA1 through LAg, in which the lowest first semiconductor integrated circuit layer LA1 is assumed to be an interface or control chip and the other semiconductor integrated circuit layers LA2 through LAg are assumed to be slave chips including core memory chips. The first through gth semiconductor integrated circuit layers LA1 through LAg may transmit and receive signals therebetween through through-substrate vias (e.g., through-silicon vias TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the gth semiconductor integrated circuit layer LAg or 620 as the slave chip.

The first semiconductor integrated circuit layer 610 may include various peripheral circuits for driving memory regions 621 provided in the gth (g is a natural number greater than 2) semiconductor integrated circuit layer 620. For example, the first semiconductor integrated circuit layer 610 may include a row (X)-driver 6101 for driving word lines of a memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of sub-arrays as described with reference to FIGS. 12 and 24, and each of the sub-arrays may include a plurality of dynamic memory cells as described with reference to FIG. 5.

The first semiconductor integrated circuit layer 610 may further include a control circuit 6107. The control circuit 6107 may control an access to the memory region 621 based on a command and an address signal from a memory controller and may generate control signals for accessing the memory region 621.

The gth semiconductor integrated circuit layer 620 may include a refresh counter and a row decoder for refreshing memory cells in the memory region 621. The refresh counter may output an abbreviated row address by sequentially counting first through third states repeatedly, the row decoder may vary a number of word lines that are simultaneously selected according to states of upper first and second bits of the abbreviated refresh row address. As a number of omitted bits in a row address designating one memory cell row increases, a number of word lines that are simultaneously selected also increases. In addition, since a number of word lines that are simultaneously selected may correspond to a value between two's multiples, increase of power consumption and noise may be prevented.

Figure 30:
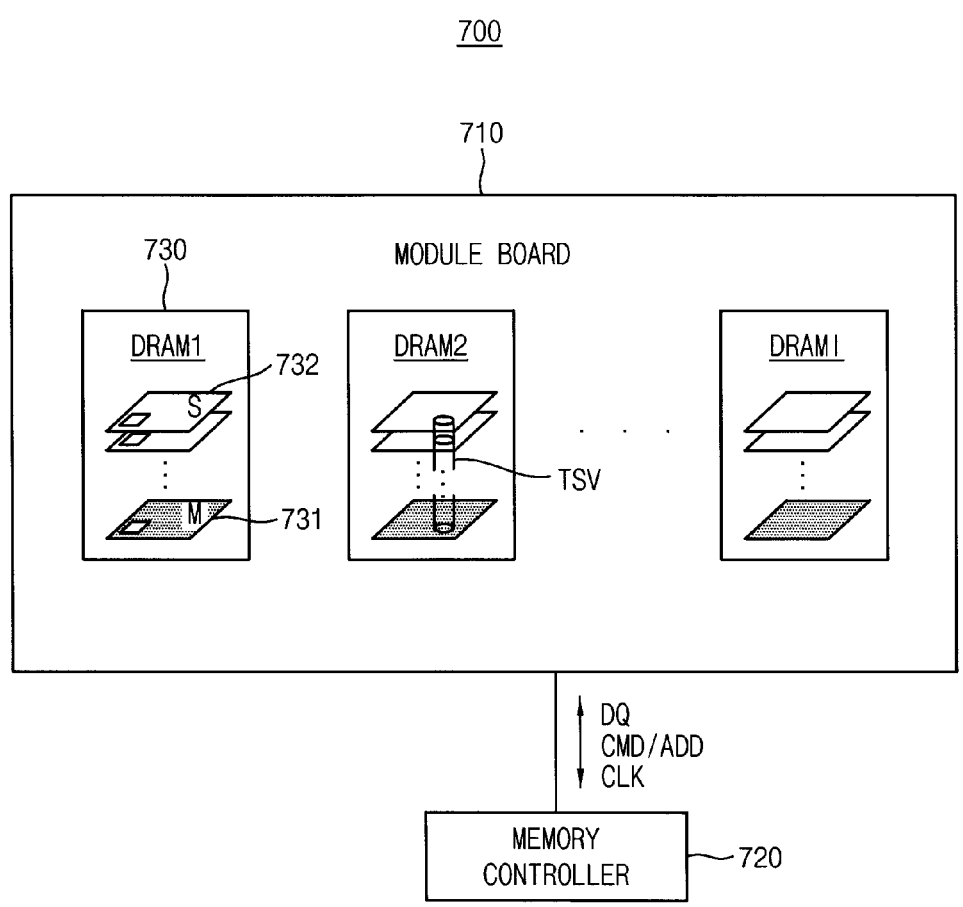
FIG. 30 illustrates a memory system including the semiconductor memory device according to example embodiments.

FIG. 30 illustrates a memory system including the semiconductor memory device according to example embodiments.

Referring to FIG. 30, a memory system 700 may include a memory module 710 and a memory controller 720. The memory module 710 may include at least one semiconductor memory device 730 mounted on a module board. The semiconductor memory device 730 may employ the semiconductor memory device 200a of FIG. 3. For example, the semiconductor memory device 730 may be constructed as a DRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-substrate vias (e.g., through-silicon vias TSV).

At least one of the master chip 731 and the slave chip 732 may employ the semiconductor memory device 200a of FIG. 3. Therefore, at least one of the master chip 731 and the slave chip 732 may include a memory cell array having a plurality of dynamic memory cells, and a refresh counter and a row decoder configured to refresh the dynamic memory cells. The refresh counter may output abbreviated row address by sequentially counting first through third states repeatedly, the row decoder may vary a number of word lines that are simultaneously selected according to states of upper first and second bits of the abbreviated refresh row address. As a number of omitted bits in a row address designating one memory cell row increases, a number of word lines that are simultaneously select also increases. In addition, a number of word lines that are simultaneously selected may correspond to a value between two's multiples, increase of power consumption and noise may be prevented.

The memory module 710 may communicate with the memory controller 720 via a system bus. Data DQ, a command/address CMD/ADD, and a clock signal CLK may be transmitted and received between the memory module 710 and the memory controller 720 via the system bus.

Figure 31:
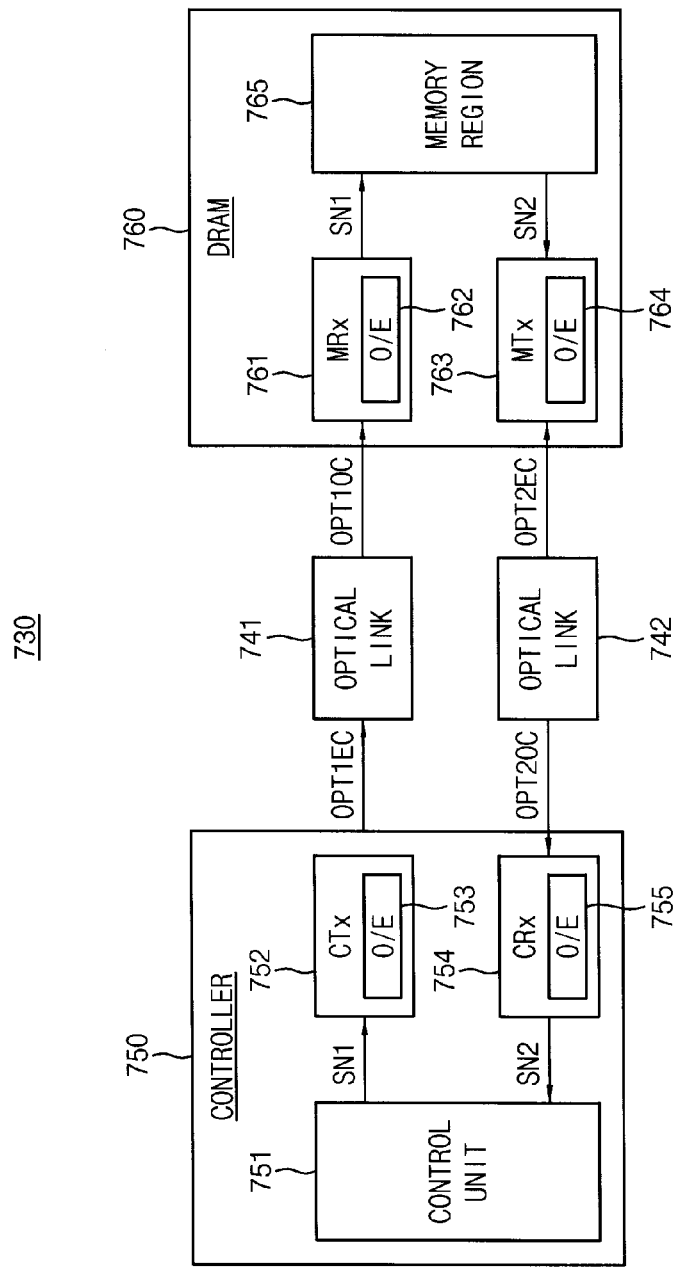
FIG. 31 is a block diagram illustrating a memory system including the semiconductor memory device according to example embodiments.

FIG. 31 is a block diagram illustrating a memory system including the semiconductor memory device according to example embodiments.

Referring to FIG. 31, a memory system 730 may include optical links 741 and 742, a controller 750, and a semiconductor memory device 760. The semiconductor memory device 760 may employ the semiconductor memory device 200a of FIG. 3. The optical links 741 and 742 interconnect the controller 750 and the semiconductor memory device 760. The controller 750 may include a control unit 751, a first transmitter 752, and a first receiver 754. The control unit 751 may transmit a first electrical signal SN1 to the first transmitter 752. The first electrical signal SN1 may include command signals, clock signals, address signals, or write data transmitted to the semiconductor type memory device 760.

The first transmitter 752 may include a first optical modulator 753, and the first optical modulator 753 may convert the first electrical signal SN1 into a first optical transmission signal OTP1EC and may transmit the first optical transmission signal OTP1EC to the optical link 741. The first optical transmission signal OTP1EC may be transmitted by serial communication through the optical link 741.

The first receiver 754 may include a first optical demodulator 755, and the first optical demodulator 755 may convert a second optical reception signal OPT2OC received from the optical link 742 into a second electrical signal SN2 and may transmit the second electrical signal SN2 to the control unit 750.

The semiconductor memory device 760 may include a second receiver 761, a memory region 765 including a plurality of dynamic memory cells, and a second transmitter 764. Also, the semiconductor memory device 760 may include an interface unit that provides various interface functions. The second receiver 761 may include a second optical demodulator 762, and the second optical demodulator 762 may convert the first optical reception signal OPT1OC received from the optical link 741 into the first electrical signal SN1 and may transmit the first optical reception signal OPT1OC to the memory region 765.

In the memory region 765, write data is written to the dynamic memory cells in response to the first electrical signal SN1, or data read from the memory region 765 is transmitted as a second electrical signal SN2 to the second transmitter 764. The second electrical signal SN2 may include clock signals and read data transmitted to the memory controller 750. The second transmitter 763 may include a second optical modulator 764, and the second optical modulator 764 may convert the second electrical signal SN2 into the second optical data signal OPT2EC and transmits the second optical data signal OPT2EC to the optical link 742. The second optical transmission signal OTP2EC may be transmitted by serial communication through the optical link 742.

Figure 32:
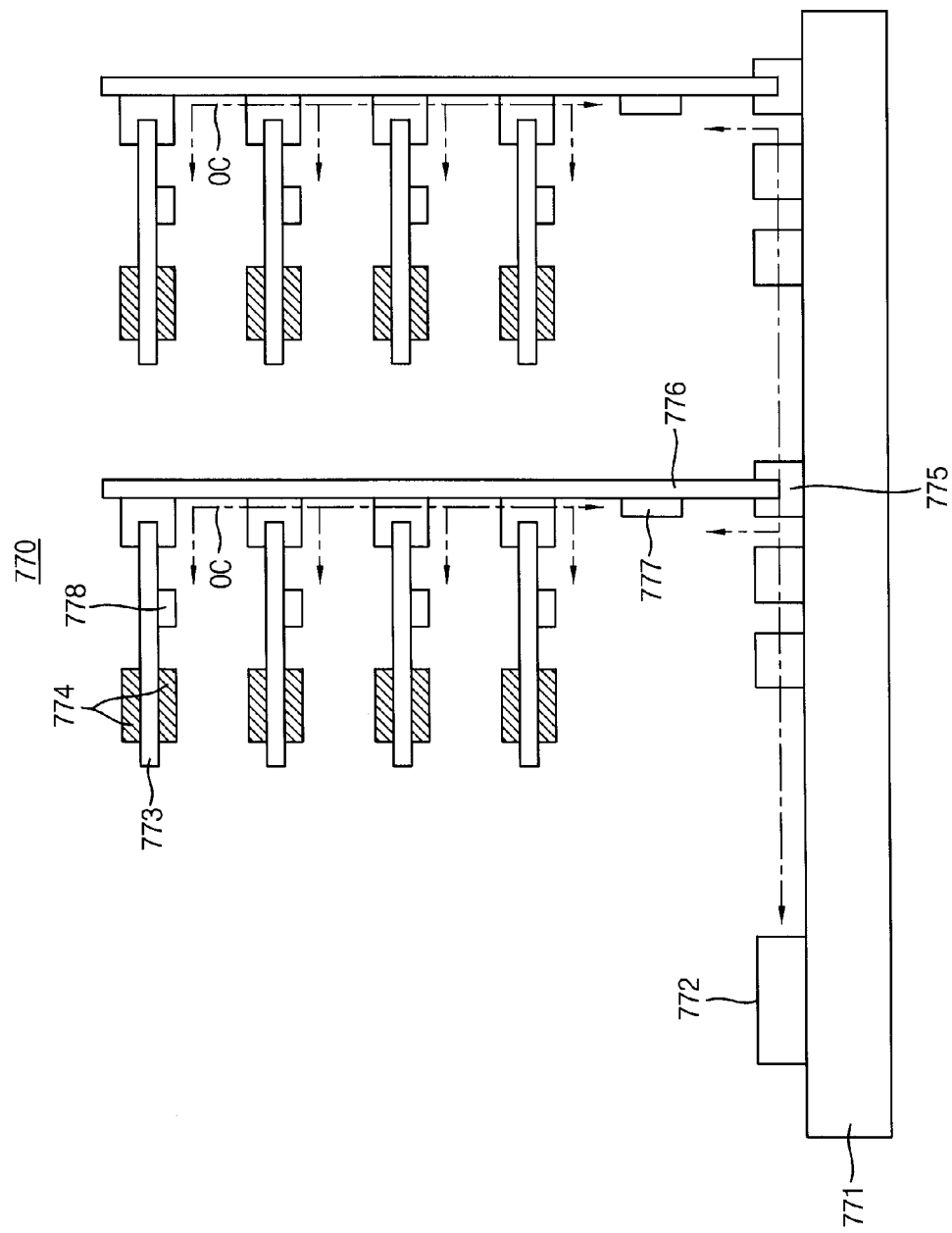
FIG. 32 is a block diagram illustrating a server system including the semiconductor memory device according to example embodiments.

FIG. 32 is a block diagram illustrating a server system including the semiconductor memory device according to example embodiments.

Referring to FIG. 32, a server system 770 includes a memory controller 772 and a plurality of memory modules 773. Each of the memory modules 773 may include a plurality of semiconductor memory devices 774. Each of the semiconductor memory devices 774 may employ the semiconductor memory device 200a of FIG. 3. Each of the semiconductor memory devices 774 may include a plurality of dynamic memory cells, and a refresh counter and a row decoder configured to refresh the dynamic memory cells.

In the server system 770, a second circuit board 776 is coupled to each of sockets 775 of a first circuit board 771. The server system 770 may be designed to have a channel structure in which one second circuit board 776 is connected to the first circuit board 771 according to signal channels.

Meanwhile, a signal of the memory modules 773 may be transmitted via an optical IO connection. For the optical IO connection, the server system 770 may further include an electric-to-optical conversion unit 777, and each of memory modules 773 may further include an optical-to-electrical conversion unit 778.

The memory controller 772 is connected to the electric-to-optical conversion unit 777 through an electrical channel EC. The electric-to-optical conversion unit 777 converts an electrical signal received from the memory controller 772 through the electrical channel EC into an optical signal and transmits the optical signal to an optical channel OC. Also, the electric-to-optical conversion unit 777 converts an optical signal received through the optical channel OC into an electrical signal and transmits the electrical signal to the electrical channel EC.

The memory module 773 is connected to the electric-to-optical conversion unit 777 through the optical channel OC. An optical signal applied to the memory module 773 may be converted into an electrical signal through the optical-to-electric conversion unit 778 and may be transmitted to the semiconductor memory chips 774. The server system 770 including the optical connection memory modules may support high storage capacity and a high processing speed.

Figure 33:
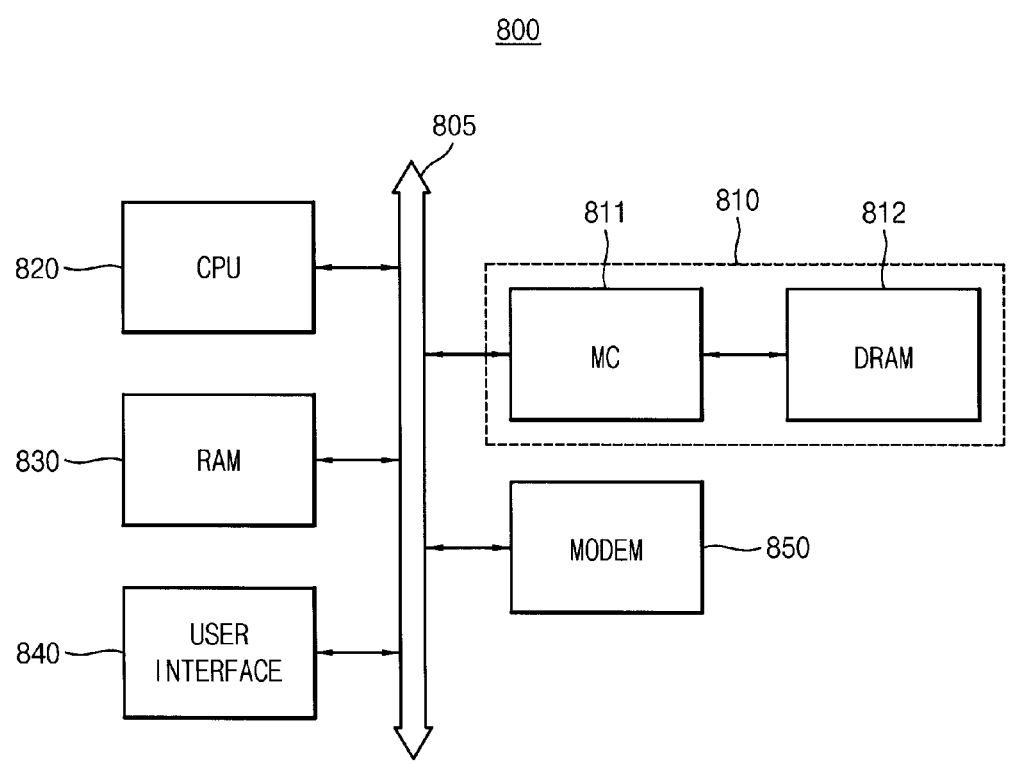
FIG. 33 is a block diagram illustrating a computing system including the semiconductor memory device according to example embodiments.

FIG. 33 is a block diagram illustrating a computing system including the semiconductor memory device according to example embodiments.

Referring to FIG. 33, a computing system 800 may be mounted on a mobile device or a desktop computer. The computing system 800 may include a memory system 810, a central processing unit (CPU) 820, a RAM 830, a user interface 840, and a modem 850 such as a baseband chipset, which are electrically connected to a system bus 805. The computing system 800 may further include an application chipset, a camera image processor (CIS), and an input/output device.

The user interface 840 may be an interface for transmitting data to a communication network or receiving data from the communication network. The user interface 840 may have a wired or wireless form, and may include an antenna or a wired/wireless transceiver. Data applied through the user interface 840 or the modem 850 or processed by the CPU 820 may be stored in the memory system 810.

The memory system 810 includes a semiconductor memory device 812 such as DRAM and a memory controller 811. Data processed by the CPU 820 or external data is stored in the semiconductor memory device 812. The semiconductor memory device 812 may be, for example, a semiconductor memory device such as described above in connection with FIG. 3. The semiconductor memory device 812 may include a plurality of dynamic memory cells, and a refresh counter and a row decoder configured to refresh the dynamic memory cells.

When the computing system 800 is a device that performs wireless communications, the computing system 800 may be used in a communication system such as code division multiple access (CDMA), global system for mobile communication (GSM), North American multiple access (NADC), or CDMA2000. The computing system 800 may be mounted on an information processing device such as a personal digital assistant (PDA), a portable computer, a web tablet, a digital camera, a portable media player (PMP), a mobile phone, a wireless phone, or a laptop computer.

Although a system includes a separate storage unit for storing a large amount of data such as a cache memory or a RAM having a high processing speed, these memories may be replaced by one memory system of the present disclosure. Accordingly, since a large amount of data may be rapidly stored in a memory device, a computing system may have a simple structure.

Figure 34:
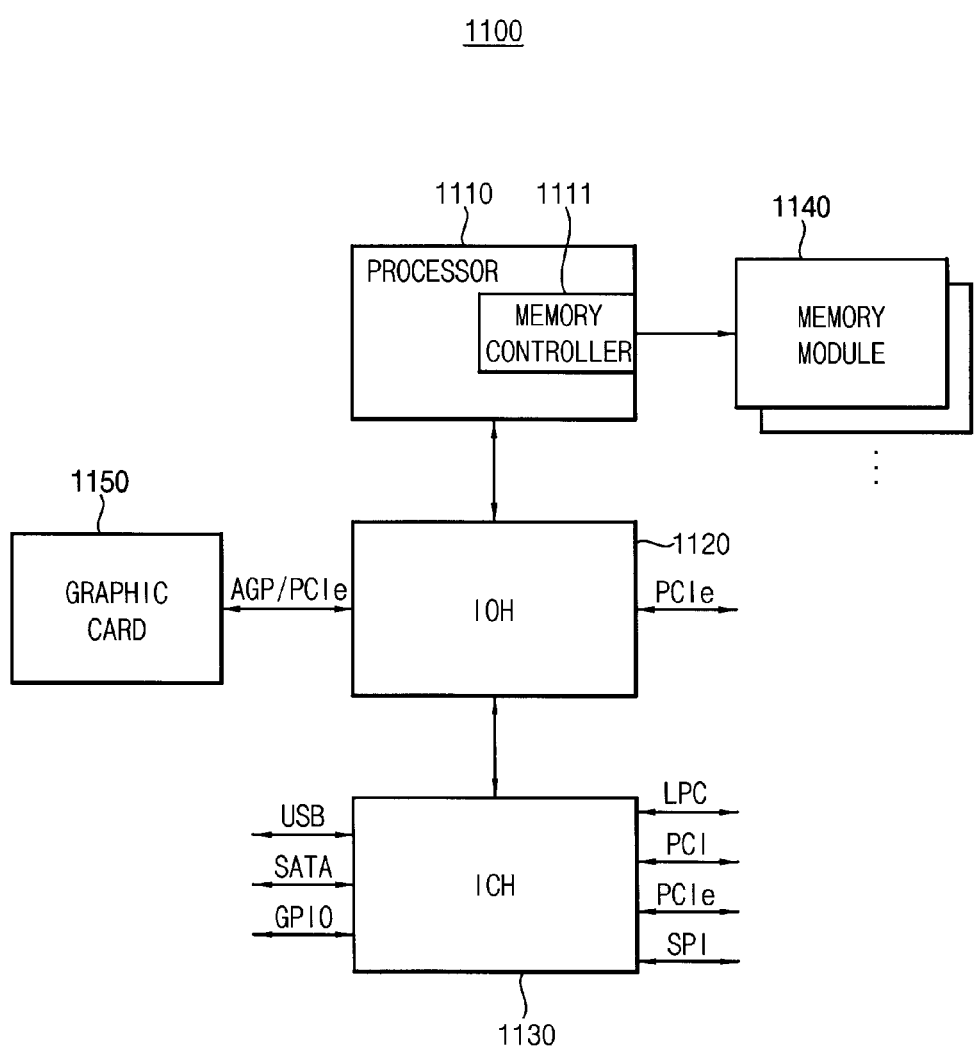
FIG. 34 is a block diagram illustrating a computing system including the semiconductor memory device according to example embodiments.

FIG. 34 is a block diagram illustrating a computing system including the semiconductor memory device according to example embodiments.

Referring to FIG. 34, a computing system 1100 may include a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may employ the semiconductor memory device 200a of FIG. 3. Therefore, each of the plurality of semiconductor memory devices may include a plurality of dynamic memory cells, and a refresh counter and a row decoder configured to refresh the dynamic memory cells.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a Quick-Path interconnect (QPI), a common system interface (CSI), etc. Although FIG. 21 illustrates the computing system 1100 including one input/output hub 1120, in some embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In some embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

The present disclosure may be applied to systems using memory controllers and semiconductor memory devices. The present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device, comprising:
    a memory cell array comprising a plurality of memory cell rows;
    a first decoder configured to perform a refresh on a first number of memory cell rows of the plurality of memory cell rows based on a selected refresh row address of a set of refresh row addresses; and
    a second decoder configured to perform a refresh on a second number of memory cell rows of the plurality of memory cell rows based on the selected refresh row address,
    wherein a total number of the first number of rows and the second number of rows is varied in response to the selected refresh row address.

2. The semiconductor memory device of claim 1, wherein the first number of rows is greater than or less than the second number of rows.

3. The semiconductor memory device of claim 1, wherein the first number of rows and the second number of rows are simultaneously selected in response to the selected row address.

4. The semiconductor memory device of claim 1, further comprising:
    a refresh counter configured to generate the set of refresh row addresses in response to a refresh command;
    a refresh signal generator configured to generate a refresh enable signal such that the first and second decoder perform a refresh operation, in response to the refresh command; and
    an address converting circuit configured to convert a first decoded row address to a converted row address, and to provide the converted row address to the second decoder,
    wherein the first decoded row address is provided to the first decoder.

5. The semiconductor memory device of claim 1, wherein the memory cell array includes a plurality bank arrays and the memory cell rows are included in one of the plurality bank arrays, and
    wherein each address of the set of refresh row addresses is an r-bit refresh row address obtained by omitting at least one bit of q bits from a p-bit address for selecting memory cell rows, wherein q is a natural number greater than zero, r is a natural number greater than q and p=q+r.

6. The semiconductor memory device of claim 5, wherein each of the bank arrays is divided into at least a first sub-array group and a second sub-array group based on at least one bit of the omitted q bits.

7. The semiconductor memory device of claim 6, wherein the first decoder is configured to perform a refresh on the first number of rows in the first sub-array group based on the selected refresh row address.

8. The semiconductor memory device of claim 6, wherein the second decoder is configured to perform a refresh on the second number of rows in the second sub-array group based on the selected refresh row address.

9. The semiconductor memory device of claim 6, wherein each of at least the first sub-array group and the second sub-array group includes a plurality of sub-arrays, and at least two adjacent sub-arrays of the plurality of sub-arrays do not share a bit line sense amplifier.

10. A method of performing a refresh operation for a semiconductor memory device that includes a memory cell array having a plurality of memory cell rows, the method comprising:
    performing, by a first decoder, the refresh operation on a first number of memory cell rows of the plurality of memory cell rows based on a selected refresh row address of a set of refresh row addresses; and
    performing, by a second decoder, the refresh operation on a second number of memory cell rows of the plurality of memory cell rows based on the selected refresh row address,
    wherein a total number of the first number of rows and the second number of rows is varied in response to the selected refresh row address.

11. The method of claim 10, wherein the first number of rows is greater than or less than the second number of rows.

12. The method of claim 10, wherein performing the refresh operation comprises:
    selecting the first number of rows and the second number of rows simultaneously.

13. A semiconductor memory device, comprising:
    a memory cell array including a plurality of word lines, each word line connected to memory cells;
    a refresh counter configured to generate a plurality of refresh row addresses in response to a refresh command; and
    a row decoder configured to simultaneously select only a first set of word lines based on a selected refresh row address of the plurality of refresh row addresses, such that a first set of memory cells connected to the selected first set of word lines are refreshed,
    wherein a total number of word lines of the first set of word lines is not equal to $2^n$, n is a natural number equal to or greater than 2.

14. The semiconductor memory device of claim 13, wherein the row decoder is configured to generate a first set of refresh addresses based on the generated refresh row addresses, and a second set of refresh addresses based on the generated first set of refresh addresses,
  wherein the row decoder includes a first row decoder configured to simultaneously select a second set of word lines at a first time based on a selected refresh address of the first set of refresh addresses, and a second row decoder configured to simultaneously select a third set of word lines at the first time based on a selected refresh address of the second set of refresh addresses, and
  wherein a number of one of the second and third sets of word lines is $2^n$, and the other is $2^{n-1}$.

15. The semiconductor memory device of claim 13, wherein the refresh counter includes:
  first and second circuits configured to generate first and second refresh row addresses of the refresh row addresses, respectively, in response to the refresh command;
  a third circuit configured to generate a third refresh row address of the refresh row addresses in response to the generated second refresh row address; and
  a fourth set of circuits configured to generate each of a fourth set of refresh row addresses in response to a corresponding previous generated refresh row address.

16. The semiconductor memory device of claim 15, wherein the first and second circuits are configured to output sequentially and repeatedly a respective pair of two bits in response to the refresh command, and
  wherein a number of states of the respective pair of two bits is 3.

17. The semiconductor memory device of claim 13, wherein the refresh counter comprises:
  a first divider configured to generate a first bit of an r-bit abbreviated refresh row address obtained by omitting at least one bit of q bits from a p-bit address for selecting a number of memory cell rows in response to a refresh command, wherein q is a natural number greater than zero, r is a natural number greater than q and p, wherein p is q+r;
  a second divider configured to generate a second bit of the abbreviated refresh row address in response to the refresh command; and
  a counting block configured to generate a third set of bits of the abbreviated refresh row address different from the first bit and second bit in response to the second bit.

18. The semiconductor memory device of claim 17, wherein the second divider and the first divider are configured to output the second bit and the first bit, respectively, from a first state to a third state sequentially,
  wherein the first state corresponds to '00', the second state corresponds to '01' and the third state corresponds to '11', and
  wherein the counting block is configured to generate a third bit of the third set of bits by one after the second divider and the first divider output the second bit and the first bit as the third state, the third bit being adjacent to the second bit.

19. The semiconductor memory device of claim 17, wherein the first divider includes a NOR gate and first through fourth D flip-flops, and each of the first through fourth D flip-flops includes a data terminal, a clock terminal, an output terminal and an inverted output terminal.

20. The semiconductor memory device of claim 17, wherein the counting block includes a plurality of unit dividers configured to respectively generate the third set of bits.

* * * * *